United States Patent
Rockenberger et al.

(10) Patent No.: US 8,900,915 B2
(45) Date of Patent: Dec. 2, 2014

(54) EPITAXIAL STRUCTURES AND METHODS OF FORMING THE SAME

(75) Inventors: Joerg Rockenberger, San Jose, CA (US); Fabio Zürcher, Brisbane, CA (US); Mao Takashima, Cupertino, CA (US)

(73) Assignee: Thin Film Electronics ASA, Oslo (NO)

( * ) Notice: Subject to any disclaimer, the term of this patent is extended or adjusted under 35 U.S.C. 154(b) by 450 days.

(21) Appl. No.: 13/081,257
(22) Filed: Apr. 6, 2011

(65) Prior Publication Data
US 2011/0240997 A1    Oct. 6, 2011

Related U.S. Application Data

(60) Provisional application No. 61/321,458, filed on Apr. 6, 2010.

(51) Int. Cl.
| | | |
|---|---|---|
| H01L 31/078 | (2012.01) | |
| H01L 21/02 | (2006.01) | |
| H01L 31/068 | (2012.01) | |
| H01L 31/18 | (2006.01) | |

(52) U.S. Cl.
CPC .......... *H01L 21/0237* (2013.01); *Y02E 10/547* (2013.01); *H01L 21/02661* (2013.01); *H01L 21/02628* (2013.01); *H01L 21/02428* (2013.01); *H01L 31/068* (2013.01); *H01L 21/02587* (2013.01); *H01L 31/1804* (2013.01); *H01L 21/02532* (2013.01); *H01L 21/02494* (2013.01); *H01L 21/0243* (2013.01)
USPC .......................................................... 438/96

(58) Field of Classification Search
USPC ................. 257/40, 90, 49; 136/258, 255; 438/96–98, 482, 488
See application file for complete search history.

(56) References Cited

U.S. PATENT DOCUMENTS 7,521,340 B2    4/2009  Lemmi et al.
7,572,740 B2    8/2009  Terry et al.
(Continued)

FOREIGN PATENT DOCUMENTS

| WO | 2008-076744 A1 | 6/2008 |
|---|---|---|
| WO | 2008/076744 A1 | 6/2008 |

(Continued)

OTHER PUBLICATIONS

International Search Report including Search History and Written Opinion; International Application No. PCT/US2011/031392; Dated Jun. 13, 2011; 10 pages; International Searching Authority / United States; Commissioner for Patents; Alexandria, Virginia.

(Continued)

*Primary Examiner* — Nathan Ha
(74) *Attorney, Agent, or Firm* — Andrew D. Fortney; Central California IP Group, P.C.

(57) ABSTRACT

Epitaxial structures, methods of making epitaxial structures, and devices incorporating such epitaxial structures are disclosed. The methods and the structures employ a liquid-phase Group IVA semiconductor element precursor ink (e.g., including a cyclo- and/or polysilane) and have a relatively good film quality (e.g., texture, density and/or purity). The Group IVA semiconductor element precursor ink forms an epitaxial film or feature when deposited on a (poly)crystalline substrate surface and heated sufficiently for the Group IVA semiconductor precursor film or feature to adopt the (poly) crystalline structure of the substrate surface. Devices incorporating a selective emitter that includes the present epitaxial structure may exhibit improved power conversion efficiency relative to a device having a selective emitter made without such a structure due to the improved film quality and/or the perfect interface formed in regions between the epitaxial film and contacts formed on the film.

28 Claims, 10 Drawing Sheets

(56) References Cited

U.S. PATENT DOCUMENTS

| | | |
|---|---|---|
| 7,615,393 B1 | 11/2009 | Shah et al. |
| 7,619,248 B1 | 11/2009 | Cleeves |
| 7,704,866 B2 | 4/2010 | Vanheusden et al. |
| 7,718,707 B2 | 5/2010 | Kelman et al. |
| 7,758,697 B2 | 7/2010 | Comita et al. |
| 7,776,724 B2 | 8/2010 | Lemmi et al. |
| 7,851,336 B2 | 12/2010 | Poplavskyy et al. |
| 7,897,489 B2 | 3/2011 | Rogojina |
| 2009/0071539 A1* | 3/2009 | Choi et al. .................... 136/258 |
| 2009/0242019 A1* | 10/2009 | Ramamoorthy et al. ..... 136/255 |
| 2010/0167510 A1 | 7/2010 | Kelman et al. |
| 2010/0176338 A1 | 7/2010 | Cannady et al. |
| 2010/0221903 A1 | 9/2010 | Poplavskyy et al. |
| 2011/0003465 A1 | 1/2011 | Scardera et al. |
| 2011/0003466 A1 | 1/2011 | Scardera et al. |

FOREIGN PATENT DOCUMENTS

| | | |
|---|---|---|
| WO | 2008-137811 A2 | 11/2008 |
| WO | 2008/137811 A2 | 11/2008 |
| WO | 2009-131587 A1 | 10/2009 |
| WO | 2009/131587 A1 | 10/2009 |

OTHER PUBLICATIONS

International Preliminary Report on Patentability; International Application No. PCT/US2011/031392; Dated Oct. 9, 2012; 5 pages; The International Bureau of WIPO, Geneva, Switzerland.

European Search Report for Appl. No. EP 11 76 6641; Jul. 3, 2014.

European Search Report for PCT/US2011031392; June 25, 2014.

\* cited by examiner

EPITAXIAL STRUCTURES AND METHODS OF FORMING THE SAME

RELATED APPLICATIONS

This application claims the benefit of U.S. Provisional Application No. 61/321,458, filed on Apr. 6, 2010, which is incorporated herein by reference in its entirety.

FIELD OF THE INVENTION

The present invention generally relates to the field of materials and films for electronic applications. More specifically, embodiments of the present invention pertain to epitaxial structures, methods of forming epitaxial structures, and devices comprising epitaxial structures.

BACKGROUND

Selective emitters in solar cells (e.g., an emitter having very highly doped regions under metal contacts and having moderate to highly doped regions in other areas of the cell) are desirable because they allow for improved electrical conductivity between the metal contact and a P- or N-type doped region of the solar cell without negatively impacting light absorption of the cell in other areas when compared to a conventional solar cell without a selective emitter structure. Such selective emitters generally increase the power efficiency of a solar cell by increasing the currency extraction from the cell thereby lowering the cost of power produced from sunlight. For example, a conventional solar cell 100, as shown in FIG. 1, utilizing a p-type silicon substrate 110 (e.g. a wafer, a ribbon, thin film, etc., of p-type silicon) generally includes an N+ doped silicon layer 120 thereon and a P+ doped region 115 on the backside thereof. The conventional cell 100 further includes contacts 130a-c and an anti-reflective coating 140 on the doped silicon layer 120, and a backside contact 145. However, with such a conventional solar cell, current extraction and power conversion efficiency is limited by relatively high contact resistance between the N+ doped silicon 120 and the metallization contacts 130a-c. In principle, increasing the doping levels in doped silicon layer 120 to improve contact resistance would seem beneficial, but increased light absorption, especially in the UV and blue part of sunlight, by a highly doped N++ layer in areas not covered by the metal contacts decreases the amount of charge carriers generated in substrate 110 upon light absorption, and hence reduces the power conversion efficiency of such a cell.

To address these challenges, a selective emitter cell 200, as shown in FIG. 2, may be employed. A selective emitter cell 200 generally comprises an intrinsic or P-doped substrate 210 and a P+ region 215. An N+ doped silicon layer 220 is formed on the substrate 210. In the selective emitter cell 200, the doped silicon layer 220 includes N++ regions 225a-c (which have higher N-dopant concentrations than areas in layer 220 not covered by metal contact) under and adjacent to one or more contacts 230a-c formed on the doped silicon layer 220. Like the conventional solar cell 100 of FIG. 1, the selective emitter cell 200 includes a backside contact 245 and an anti-reflective coating 240. The selective emitter structure improves contact resistance without significantly negatively impacting light absorption. This results in increased power conversion efficiency.

An absolute increase in power efficiency (e.g., of about 1 to 2%) over the conventional cell 100 in FIG. 1 having a global emitter (e.g., an emitter having a uniform dopant concentration across the surface of the solar cell) has been reported for the N+/P/P+ solar cell 200 of FIG. 2 having a selective emitter cell formed from a doped silicon nanoparticle ink. Although this increase in power efficiency provides a significant advantage, it is known that silicon nanoparticles may show poor sintering and morphology properties when subjected to thermal annealing or laser irradiation. Such properties often lead to porous and/or rough film formation. Rough and/or porous films have a negative impact on the quality of subsequently deposited layers (e.g., an antireflection coating, surface passivation, etc.) on the front surface of the solar cell and on top of the silicon substrate with the doped silicon emitter contacts. Consequently, the quality of films formed from silicon nanoparticles alone may not realize the potential maximum power efficiency of a cell having a doped silicon emitter.

SUMMARY OF THE INVENTION

Aspects of the present invention relate to epitaxial structures, methods of making epitaxial structures, and devices that utilize such epitaxial structures. The present epitaxial structures (which may be formed from a liquid-phase Group IVA semiconductor element ink comprising a (poly)silane, a (poly)germane, and/or a (poly)germasilane) may be advantageous because such inks form a relatively good film in terms of texture (smoothness), density, conformality, adhesion, electrical conductivity and purity when compared to similar films formed from a Group IVA semiconductor element nanoparticle-based ink. FIGS. 3A and 3B show cross-sectional electron microscope scans comparing cured silicon thin films made from (poly)silane-based ink and silicon nanoparticle-based ink, respectively. Specifically, as shown in FIG. 3A, the film formed from a (poly)silane-based ink is dense and smooth relative to the film(s) formed from silicon nanoparticle-based ink(s) (see, e.g., the film[s] shown in FIG. 3B). It is believed that the silicon nanoparticle-based ink produces a relatively rough and porous film because nanoparticles may have broad particle size distributions and do not always densify perfectly during sintering. Furthermore, silicon nanoparticles may carry a surface oxide and exhibit poor sintering properties, either one may lead to porous and/or rough films. In addition, nanoparticle ink formulations may require surface modification of silicon nanoparticles, may comprise dispersing agents to formulate a silicon nanoparticle ink, either one of which can introduce impurities into subsequently formed films which may further limit the extent of densification upon curing and affect the electrical performance of such films.

Upon coating or printing and curing, liquid-phase Group IVA semiconductor element inks (e.g., inks comprising a (poly)silane, a (poly)germane, and/or a (poly)germasilane) generally form films (or features) with properties comparable to conventionally deposited films (e.g., by chemical vapor deposition [CVD], physical vapor deposition [PVD], atomic layer deposition [ALD], etc.). For example, the films may have a lower porosity (e.g., having no or substantially no micro- or macroporosity), and better smoothness than films derived from Group IVA semiconductor element nanoparticle-based inks. When compared to devices or cells comprising a global emitter (e.g., as shown in FIG. 1) and/or devices or cells comprising a selective emitter (e.g., as shown in FIG. 2) formed from an ink containing only silicon nanoparticles as a silicon source, devices or cells having a selective emitter made using an ink comprising a (poly)silane, a (poly)germane and/or a (poly)germasilane may result in improved power conversion efficiency due to the improved film quality.

Furthermore, liquid-phase Group IVA semiconductor element inks comprising a cyclo- and/or (poly)silane form epitaxial films or features after curing when the ink is deposited onto a substrate having a cleaned or etched (poly)crystalline surface. The epitaxial films or features can be used to make structures such as contacts (e.g., ohmic contacts, collector contacts, source/drain contacts, selective emitters etc.), wells in analog, mixed signal and CMOS devices, and/or devices such as diodes, solar cells, MOSFET devices, SOI devices, bipolar transistors, and/or thin film transistors. Such structures and/or devices may be particularly useful in photovoltaic, light sensor, image sensor, light emitting, MEMS, display, sensor and other applications because the epitaxial films or features according to the present invention may provide a substantially perfect interface in the regions between the epitaxial film or feature and the material (e.g., a substrate) to which the film or feature makes contact, at a substantially lower cost (e.g., by coating and/or printing an ink, as compared to conventional vacuum-based epitaxial growth and possible photolithographic patterning steps). A layer or feature to be grown epitaxially on a substrate cannot be formed from a Group IVA semiconductor element nanoparticle-based ink because of the nanocrystalline nature of such particles, leading to a multitude of surface defects and varying crystallographic phases and/or orientations, their largely random orientation relative to each other in a deposited film, and their typical poor sintering behavior, as outlined above. Consequently, films formed from a Group IVA nanoparticle-based ink appear to be limited with regard to the formation of good quality epitaxial films, layers, and/or features, which may lead to the enhancement of properties such as power conversion efficiency and contact resistance that depend on the quality of the interface between the film and the material or substrate to which the film makes contact.

Embodiments of the present invention relate to methods of forming an epitaxial structure comprising (a) cleaning or etching a surface of a substrate, the surface having an exposed crystalline, polycrystalline or microcrystalline material after the cleaning or etching; (b) depositing on the exposed surface a liquid-phase ink on the crystalline, polycrystalline or microcrystalline material by printing or coating, the liquid-phase ink comprising a (poly)silane, a (poly)germane, and/or a (poly)germasilane; and (c) heating the substrate and the deposited (poly)silane, (poly)germane, and/or (poly)germasilane at a temperature and for a length of time sufficient for a film or feature formed from the (poly)silane, (poly)germane, and/or (poly)germasilane to adopt a crystalline structure of the exposed material. In many cases, the (poly)silane, (poly)germane, and/or (poly)germasilane that is heated to adopt the crystalline structure of the exposed material on the substrate may not be exactly the same as the (poly)silane, (poly)germane, and/or (poly)germasilane in the ink. For example, if the ink is irradiated (e.g., with UV light) during or immediately after deposition, the (poly)silane, (poly)germane, and/or (poly)germasilane may have a higher molecular weight and/or viscosity, be crosslinked, or have other chemical and/or physical difference(s).

Other embodiments of the present invention relate to structures comprising: (a) a substrate having a surface, the surface having an exposed crystalline, polycrystalline or microcrystalline material (e.g., in the absence of an overlying material); (b) a film or feature comprising a Group IVA semiconductor element on the exposed crystalline, polycrystalline or microcrystalline material, the film or feature having (i) a crystalline structure of the exposed material, and (ii) a first doped region; and (c) one or more contacts on the first doped region of the film or feature. In some exemplary embodiments, the Group IVA semiconductor element comprises silicon and/or germanium.

Further embodiments of the present invention relate to structures comprising (a) a substrate having a surface, the surface having an exposed crystalline, polycrystalline or microcrystalline material; and (b) a film or feature comprising a Group IVA semiconductor element on the exposed crystalline, polycrystalline or microcrystalline material, the film or feature having a crystalline structure of the exposed material and being formed from a liquid-phase ink comprising a (poly)silane, a (poly)germane, and/or a (poly)germasilane.

The present invention provides epitaxial structures, methods of forming epitaxial structures, and devices comprising epitaxial structures. The structures and methods described herein leverage the generally very good film quality obtained from a liquid-phase semiconductor ink comprising a (poly)silane, a (poly)germane, and/or a (poly)germasilane in terms of smoothness, density, conformality, purity, electronic properties, and/or porosity relative to a film made from an ink containing nanoparticles of the same Group IVA semiconductor element as the only source of the silicon and/or germanium, using an identical process under identical conditions, without a (poly)silane, (poly)germane, and/or (poly)germasilane in the ink. Consequently, the methods and structures described herein may advantageously provide devices (e.g., photovoltaic devices, solar cells, light sensors, image sensors, light emitting devices, MEMS devices, analog or bipolar devices, etc.) having improved properties (e.g., power conversion efficiency of solar cells using a selective emitter structure based on printing a doped Group IV semiconductor element precursor ink comprising a (poly)silane, (poly)germane and/or (poly)germasilane) due to improved film quality and/or epitaxial film formation, but at a cost associated with coating or printing an ink (e.g., a lower cost), rather than that associated with high-vacuum deposition equipment and possible photolithographic patterning steps.

These and other advantages of the present invention will become readily apparent from the detailed description of preferred embodiments below.

DETAILED DESCRIPTION

Figure 1:
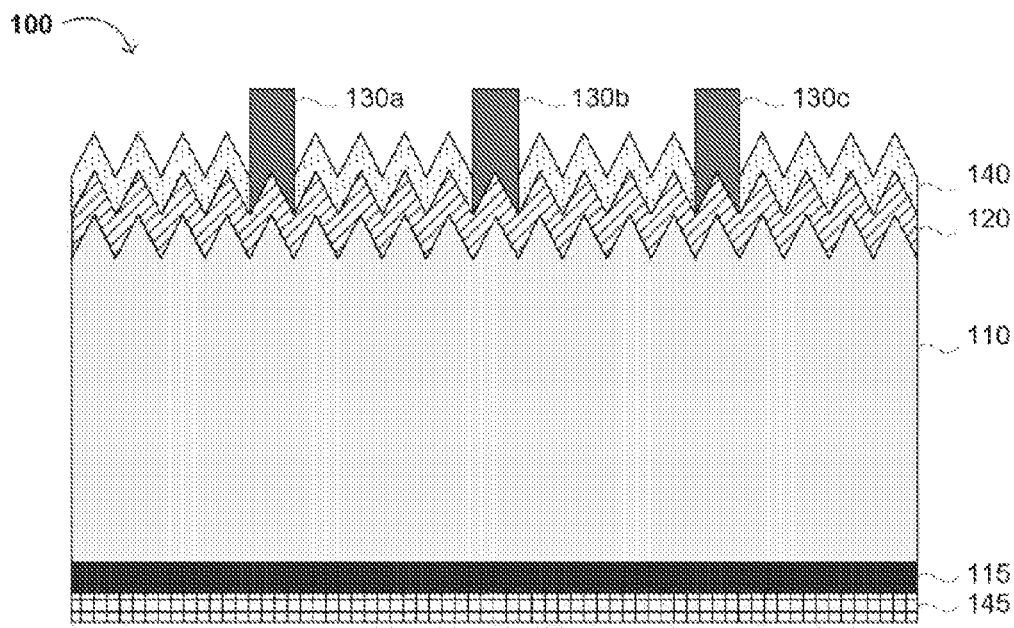
FIG. 1 is a cross-sectional view of a conventional cell structure.
Figure 2:
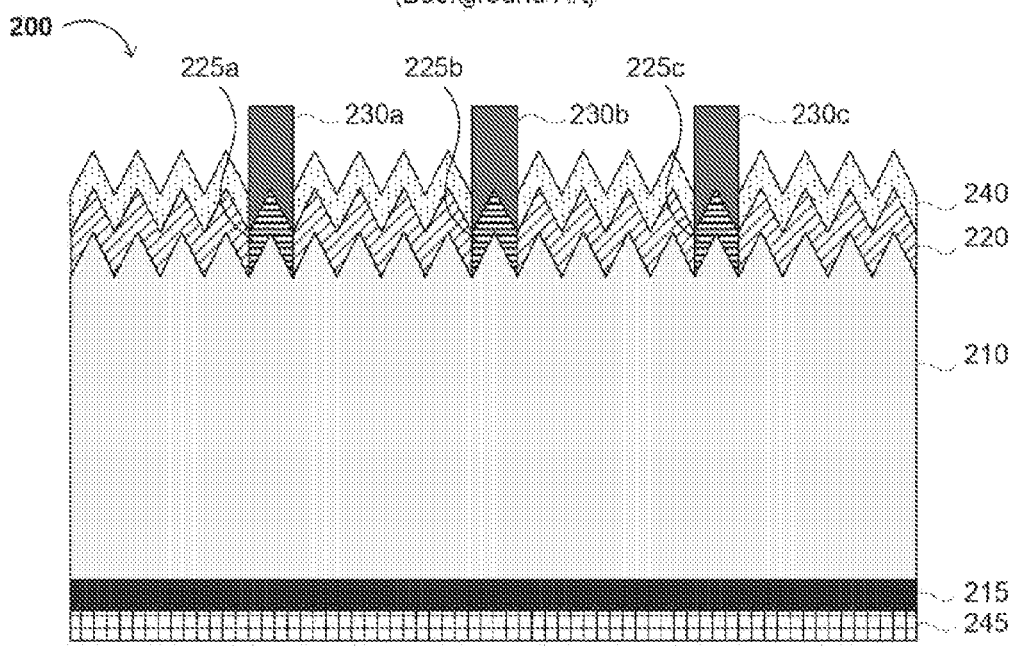
FIG. 2 is a cross-sectional view of a selective emitter cell structure.
Figure 3A:
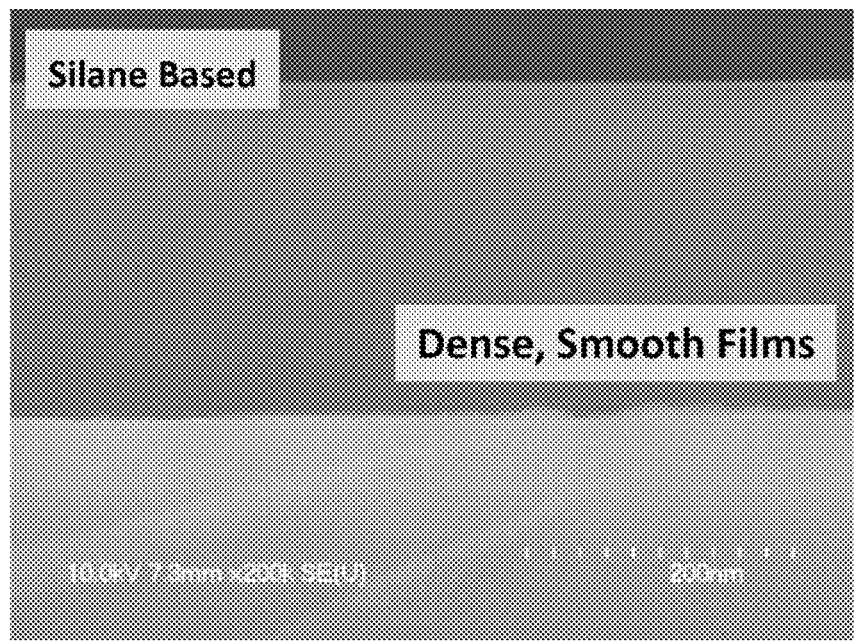
FIG. 3A is a cross-sectional electron microscope scan of a cured thin film made using a (poly)silane-based ink.
Figure 3B:
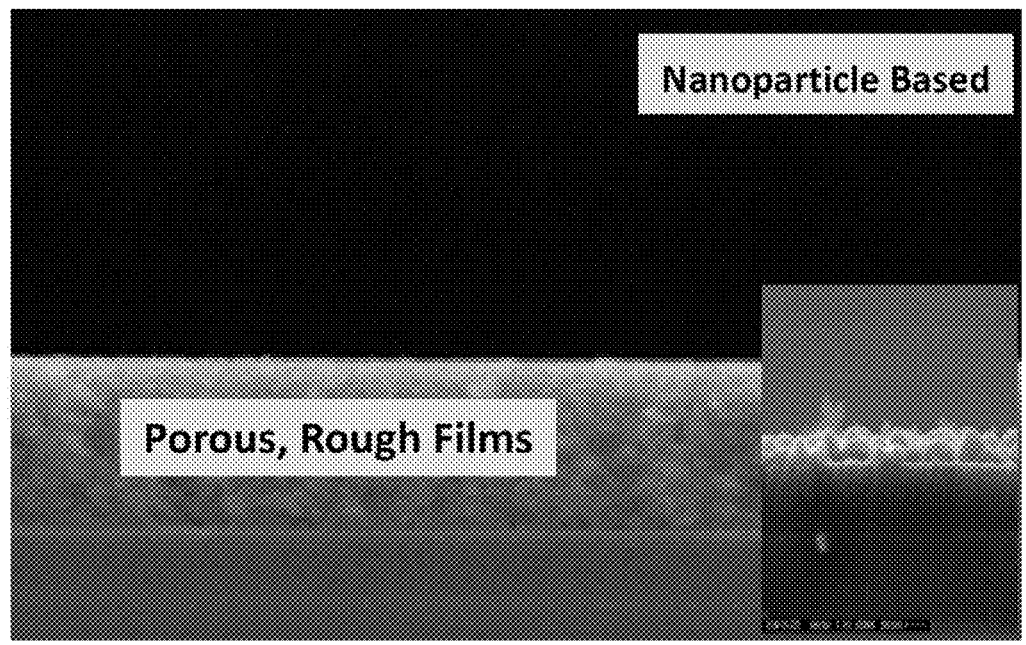
FIG. 3B is a cross-sectional electron microscope scan of a cured thin film made using a silicon nanoparticle-based ink.

Reference will now be made in detail to various embodiments of the invention. While the invention will be described in conjunction with the following preferred embodiments, it will be understood that the description is not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

In the present disclosure, the term "deposit" (and grammatical variations thereof) is intended to encompass all forms of deposition, including blanket deposition, coating, and printing, unless the context clearly indicates otherwise. In various embodiments of the method of coating or printing a metal film on a substrate, coating or printing may comprise inkjetting, gravure-, screen-, offset-, or flexo-printing, spray-coating, spin coating, slit coating, extrusion coating, dip coating, meniscus coating, microspotting and/or pen-coating the formulation onto a substrate. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties.

The term "silane" refers to a compound or mixture of compounds that contains primarily or that consists essentially of (1) silicon and/or germanium and (2) hydrogen, and the term "polysilane" refers to a silane or a mixture of silanes that predominantly contains species having at least 15 silicon and/or germanium atoms. The term "(poly)silanes" refers to compounds or groups of compounds that are silanes, polysilanes or both. Such (poly)silanes (i.e., silanes and/or polysilanes) may contain one or more cyclic rings and an amount or atomic percentage of halogen atoms (such as Cl) that does not have a significant adverse effect on the properties of a given composition for a particular application. The term "(cyclo)alkanes" refers to compounds or mixtures of compounds that consist essentially of carbon and hydrogen, and that may be linear, branched, or cyclic. The term "(cyclo)silane" refers to a compound or a mixture of compounds that contains primarily or that consists essentially of (1) silicon and/or germanium and (2) hydrogen, that may contain one or more cyclic rings, and that generally contains less than 15 silicon and/or germanium atoms. The terms "hetero(cyclo)silane" and "hetero(poly)silane" refer to compounds or mixtures of compounds that consist essentially of (1) silicon and/or germanium, (2) hydrogen, and (3) one or more dopant atoms such as B, P, As or Sb that may be substituted on the dopant atom by a conventional hydrocarbon, silyl or germyl substituent, and that may contain one or more cyclic rings or at least 15 silicon and/or germanium atoms, respectively.

"Liquid-phase" generally describes one or more materials that, alone or in combination, are in the liquid phase at an ambient temperature (e.g., from about 15° C. to about 25° C.). The term "doped silane" refers to a composition comprising (1) a Group IVA atom source (generally consisting of one or more Group IVA semiconductor elements [such as Si and/or Ge] and hydrogen) and (2) a dopant source (generally consisting essentially of one or more conventional semiconductor dopant atoms such as B, P, As, or Sb, which may have one or more covalently bound mono- or divalent hydrocarbon or silane substituents), and which may include a single species such as a hetero(cyclo)silane or hetero(poly)silane, or plural species such as a (poly)silane and an organo- or silylphosphine or -borane.

For the sake of convenience and simplicity, the terms "coupled to," "connected to," and "in communication with" mean direct or indirect coupling, connection or communication, unless the context unambiguously indicates otherwise. These terms are generally used interchangeably herein, but are generally given their art-recognized meanings. Furthermore, the terms "crystalline," "polycrystalline," and "microcrystalline" may be used interchangeably, but are generally given their art-recognized meanings. The term "(semi)conductor," "(semi)conductive" and grammatical equivalents thereof refer to materials, precursors, layers, features or other species or structures that are conductive and/or semiconductive. Also, for convenience and simplicity, the terms "part," "portion," and "region" may be used interchangeably, but these terms are also generally given their art-recognized meanings. Also, unless otherwise indicated from the context of its use herein, the terms "known," "given," "certain" and "predetermined" generally refer to a value, quantity, parameter, constraint, condition, state, process, procedure, method, practice, or combination thereof that is, in theory, variable, but is typically set in advance and not varied thereafter when in use.

The invention, in its various aspects, will be explained in greater detail below with regard to exemplary embodiments.

Exemplary Methods of Forming Epitaxial Structures

A first aspect of the present invention relates to methods of forming epitaxial structures. The method generally comprises cleaning or etching a surface of a substrate, which generally has an exposed crystalline, polycrystalline, or microcrystalline material on its surface after the cleaning or etching process. After cleaning or etching the substrate surface, the method further comprises depositing (e.g., by printing or coating) a liquid-phase ink comprising a (poly)silane, a (poly)germane, and/or a (poly)germasilane on the crystalline, polycrystalline, or microcrystalline material exposed on the substrate surface. The substrate and the (poly)silane, (poly)germane, and/or (poly)germasilane is then heated at a temperature and for a length of time sufficient for a film or feature formed from the (poly)silane, (poly)germane, and/or (poly)germasilane to adopt a crystalline structure of the crystalline, polycrystalline, or microcrystalline material on the substrate surface.

Figure 4A:
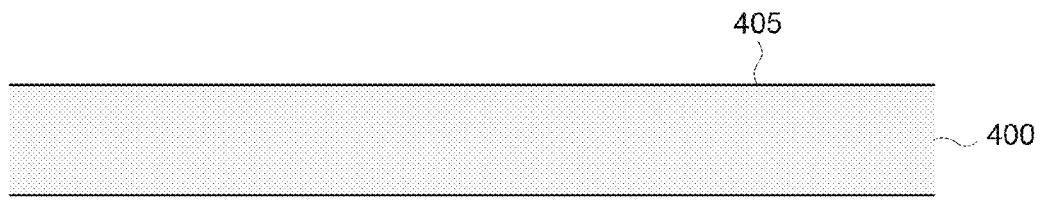
FIGS. 4A-4D are cross-sectional views showing an exemplary process for forming an epitaxial layer on a crystalline substrate according to embodiments of the present invention.

Exemplary structures formed in accordance with embodiments of the present invention are shown in FIGS. 4A-4D. Referring to FIG. 4A, in general, the substrate 400 comprises any suitable electrically active and/or mechanical support structure, having a surface 405 that exposes a partially or completely crystalline, polycrystalline, or microcrystalline material. Suitable electrically inert or inactive substrates may comprise a plate, disc, sheet and/or foil of a glass, ceramic, dielectric and/or plastic. Alternatively, suitable electrically (semi)conductive substrates may comprise a wafer, disc, sheet and/or foil of a semiconductor (e.g., silicon) and/or a metal. In some embodiments, the substrate comprises a member selected from the group consisting of a silicon wafer, a glass plate, a ceramic plate or disc, a plastic sheet or disc, metal foil, a metal sheet or disc, and laminated or layered combinations thereof. In exemplary embodiments, the substrate comprises a single-crystalline wafer, a polycrystalline wafer, a multi-crystalline wafer, a metallurgical-grade wafer, a ribbon or a band consisting essentially of the same or different Group IVA semiconductor element as the epitaxial film or feature to be formed thereon. In other embodiments, the substrate comprises a ceramic substrate (e.g., a plate, slip, wafer or disc of an oxide ceramic, such as alumina, beryllia, ceria, zirconia, etc., a non-oxide ceramic such as boron carbide, boron nitride, graphite, or a carbide, nitride, and/or boride of silicon and/or aluminum, a mixed oxide/non-oxide ceramic such as silicon oxynitride, silicon oxycarbide, silicon aluminum oxynitride, etc., or other composite ceramic) or a porous silicon substrate. In some implementations (e.g., those in which the substrate has a material on its surface other than an at least partially crystalline Group IVA element), the substrate may include one or more microcrystalline or polycrystalline thin films or features (e.g., comprising an at least partially crystalline Group IVA element) deposited on the surface of the substrate. In some implementations, the microcrystalline or polycrystalline thin film or feature may have a thickness of less than 100 μm, or preferably, less than 50 μm.

In exemplary embodiments, the exposed crystalline, polycrystalline, or microcrystalline material on the substrate surface is cleaned and/or etched prior to depositing the liquid-phase ink comprising the (poly)silane, (poly)germane, and/or (poly)germasilane (i.e., the "(poly)silane ink") thereon. Cleaning or etching the surface of the structure may remove any native oxides, residual organic material, particles and/or other contaminants (e.g. metals etc.) that might be present and adversely affect the adhesion and/or wetting of the (poly)silane ink to the substrate surface and/or adversely affect epitaxial growth or electronic properties of the formed epitaxial structure.

Suitable etching techniques may include wet etching processes (e.g., wet chemical etching) or dry etching (e.g., reactive ion etching [RIE]). Liquid- or vapor-based etchants such as aqueous hydrofluoric acid (which may be buffered with $NH_3$ and/or $NH_4F$), HF vapor, HF:pyridine, HBr, and other etchants commonly known in the art may be used to etch the substrate surface. Alternatively, the substrate surface may be cleaned by sputter etching or a plasma etching process, as is known in the art.

For example, in one embodiment, the substrate is cleaned by immersing the substrate in and/or rinsing the substrate with a liquid-phase and/or solvent-based cleaner (e.g., one that removes organic residue), followed by wet etching using a dilute aqueous acid (e.g., dil. aq. HF, which may be buffered with ammonia and/or ammonium fluoride). Alternative etch processes include a conventional piranha etch, and alternative acids for use in wet etching the substrate include nitric acid, sulfuric acid, hydrochloric acid, etc., depending on the substrate used and the temperature at which the substrate will be processed. In another embodiment, the substrate is cleaned by sputter etching. The selection of gas(es) for use in a dry etching process to clean the substrate is not particularly limited. Any gas or combination of gases that removes substantially all undesired contaminants from the surface of the substrate, but does not leave an unremovable residue, may be used. For example, an inert gas such as argon may be employed in sputter cleaning of the substrate.

In some embodiments, before or after etching, the substrate can be rinsed (e.g., with deionized water), and then optionally further cleaned by immersing and/or rinsing with an organic solvent or solvent mixture to remove undesired organic residue that may be present on the surface of the substrate. Alternatively, further cleaning of the substrate may comprise immersing and/or rinsing with an aqueous solution or suspension of a surfactant (followed by rinsing with deionized water). Suitable cleaning solvents for further cleaning of the substrate are described in detail in U.S. patent application Ser. No. 12/790,627, filed on May 28, 2010, which is incorporated by reference herein.

Figure 4B:
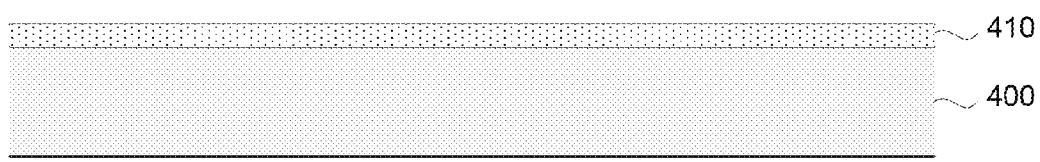

Referring to FIG. 4B, after cleaning the substrate, a liquid-phase ink 410 comprising a (poly)silane, (poly)germane, and/or (poly)germasilane precursor of a Group IVA semiconductor element (e.g., Si and/or Ge) and an optional solvent is deposited on the cleaned substrate surface. Suitable liquid-phase doped or undoped (poly)silane, (poly)germane, and/or (poly)germasilane inks, and methods for coating and printing such inks, are discussed in detail in U.S. Pat. Nos. 7,314,513, 7,498,015, 7,674,926, 7,723,457 and 7,879,696, and in co-pending U.S. patent application Ser. Nos. 11/249,167, 11/543,414, 11/867,587, 12/114,741 and 12/243,880, respectively filed on Oct. 11, 2005, Oct. 5, 2006, Oct. 4, 2007, May 2, 2008 and Oct. 1, 2008, the relevant portions of each of which are incorporated herein by reference.

In exemplary embodiments, the (poly)silane ink comprises one or more linear, branched, cross-linked, cyclic or polycyclic (poly)silanes, (poly)germanes, or (poly)silagermanes (hereinafter collectively referred to as "(poly)silanes"). For example, the (poly)silane may include one or more compounds such as perhydrosilanes, perhydrogermanes, perhydrosilagermanes, cyclosilanes, cyclogermanes, cyclosilagermanes, polysilanes, polygermanes, polysilagermanes, hetero(poly)silanes, hetero(poly)germanes, hetero(poly)silagermanes], and combinations or mixtures thereof. The cyclo- and polysilanes may be perhydrogenated, or may contain some halogens as long as the amount of the halogens does not adversely affect the properties of the ink or the characteristics of the resulting film or feature. In some embodiments, the (poly)silane ink may further comprise silicon and/or germanium nanoparticles. In further embodiments, the (poly)silane ink may further comprise compounds incorporating one or more dopant atoms (e.g. P, B, As, and/or Sb).

Specifically, in some implementations, the (poly)silane may comprise compounds having the formula $A_nH_{2n+2}$ (e.g., $Si_nH_{2n+2}$, which may be linear, branched and/or crosslinked), cyclo-$A_mH_{2m}$ (e.g., $Si_mH_{2m}$), and/or $A_nH_{2n-p}$ (e.g., $Si_nH_{2n-p}$, which may contain branched segments or crosslinks, and which includes one or more cyclic rings) where A is Si and/or Ge, n is at least 3 (e.g., from 3 to 1,000,000, 10 to 1,000, 15 to 250, or any other range of values ≥3 or ≥15), m is from 3 to about 20 (e.g., from 5 to 8, or any other range of values therein), and p is 0 or an even integer not greater than n.

In some embodiments, the (poly)silane compound may comprise (or further comprise) one or more linear, branched, cross-linked, cyclic, or polycyclic polymers or copolymers of one or more (cyclo)silanes having from 3 to 20 Si and/or Ge atoms. For example, the (cyclo)silane may have from 3 to 12 Si and/or Ge atoms, from 5 to 8 Si and/or Ge atoms, or any other range of Si and/or Ge atoms therein. In various examples, the (poly)silane may comprise a homopolymer of repeating -(-$A_kH_{2k}$—)— or -(c-$A_mH_{2m-2}$)— units (where "c" refers to a cyclic unit), a block copolymer comprising one or more blocks of -(-$A_kH_{2k}$—)— and/or -(c-$A_mH_{2m-2}$)— units (each block of which may include one or more such units in a given block), or a random copolymer of such units, any of which may be branched, cross-linked, or (poly)cyclic (e.g., condensed, or cross-linked to itself), and where k is an integer of at least 1 (e.g., 1, 2, 3, 4, 5, or more, such as from 3 to 5) and m is as previously described herein.

In some variations, the (poly)silane composition comprises one or more relatively high molecular weight (poly)silanes having, e.g., 20, 30, 40, 50, 100, 1,000, or more silicon atoms therein. Such higher molecular weight (poly)silanes may increase the viscosity of the (poly)silane composition in proportion to their mass loading, thereby improving its properties for printing applications (e.g., inkjetting). The amount of the relatively high molecular weight (poly)silane(s) may vary, and is typically an amount providing a viscosity of from about 2 to about 100,000 cP (e.g., from about 4 to about 50,000 cP, from about 4 to about 10,000 cP, from about 5 to about 5000 cP, from about 5 to about 1000 cP, or any other range of values therein). However, in some instances, the amount of (poly)silane in the ink may range from about 1% to about 40% by weight (e.g., from about 1% to about 20% by weight of the ink, or any other range of values therein).

In cases where the ink composition comprises a (poly)silane, the (poly)silane may have an atomic purity of greater than 90% with respect to silicon, germanium and hydrogen (i.e., greater than 90% of the atoms in the [poly]silane are Si, Ge or H). In one example, the (poly)silane has an atomic purity of greater than 90% with respect to silicon and hydrogen. Thus, the (poly)silane can contain up to 10 at. % of other species (such as boron, gallium, phosphorous, arsenic, antimony, halogens [e.g., F, Cl, Br, etc.], carbon, oxygen, nitrogen, etc.) as long as the other species do not significantly adversely affect the electrical properties of a film or feature formed from the (poly)silane for a given application. In one preferred embodiment, the atomic purity is greater than 99%.

The liquid-phase (poly)silane ink may further comprise a solvent in which the precursor material is soluble. The solvent may be one that provides a relatively high degree of stability to the ink composition, has low impurity levels, and/or is easily purified from such, provides an advantageous viscosity and/or volatility (e.g., sufficient to prevent inkjet nozzle clogging and allow printed ink to dry at relatively low temperatures and/or relatively short times, etc.) and/or that is generally easily and/or thoroughly removable from the ink composition. In exemplary embodiments, the solvent is one that is substantially completely removed by printing the ink onto a platen at a temperature of 30-90° C., followed by heating for 10 minutes at 100° C. For example, the solvent may comprise one or more hydrocarbon solvents, such as an alkane, a mono- or bicycloalkane (e.g., cyclooctane, decalin, dicyclopentane, etc.), an alkyl-substituted mono- or bicycloalkane, a (cyclic) siloxane, an aliphatic alcohol (e.g., a $C_1$-$C_{20}$ alcohol such as methanol, ethanol, butanol, hexanol, octanol, decanol, dodecanol, icosanol, cyclohexanol, cyclooctanol, terpineol, borneol, etc.), and/or a fluoroalkane.

Suitable solvents are generally those that are liquid at ambient temperatures (e.g., 15-30° C.). Thus, the solvent may be selected from the group consisting of $C_5$-$C_{12}$ linear and/or branched alkanes; $C_6$-$C_{12}$ monocycloalkanes; $C_3$-$C_8$ monocycloalkanes substituted with from 1 to 2n $C_1$-$C_4$ alkyl or halogen substituents or from 1 to n $C_1$-$C_4$ alkoxy substituents, where n is the number of carbon atoms in the monocycloalkane ring; siloxanes of the formula $(R_3Si)(OSiR_2)_p(OSiR_3)$ and cyclosiloxanes of the formula $(SiR'_2O)_q$, where p is from 0 to 4, q is from 2 to 6 (preferably from 3 to 5), each R and R' is independently H, $C_1$-$C_6$ alkyl, benzyl or phenyl substituted with from 0 to 3 $C_1$-$C_4$ alkyl groups (preferably R' is methyl); and $C_3$-$C_8$ fluoroalkanes substituted with from 1 to (2m+2) fluorine atoms and that are liquid at ambient temperatures, where m is the number of carbon atoms in the fluoroalkane. In one implementation, the solvent comprises a $C_5$-$C_{10}$ cycloalkane (e.g., cyclohexane, cycloheptane, cyclooctane, cis-decalin, etc.). In another implementation, the solvent comprises one or more $C_5$-$C_{10}$ mono- and/or bicycloalkanes, which may be substituted by up to 3 $C_1$-$C_4$ alkyl groups. However, other apolar and/or non-polar solvents (e.g., saturated hydrocarbons such as $C_5$-$C_{12}$ alkanes, aliphatic ethers such as di-$C_2$-$C_6$ alkyl ethers, methyl $C_4$-$C_6$ alkyl ethers and di-$C_1$-$C_4$ alkyl $C_2$-$C_6$ alkylene diethers [e.g., glyme], cyclic ethers such as tetrahydrofuran and dioxane, arenes such as benzene, toluene and xylenes, etc.) may be included in the present formulation.

In some exemplary embodiments, the liquid-phase (poly)silane ink (e.g., a (poly)silane ink) may include one or more dopant atoms to form high conductivity N+ and/or P+ silicon films or features. For example, the liquid-phase ink may comprise a dopant source such as boron, gallium, phosphorous, arsenic, or antimony (e.g., one or more organophosphines, organoboranes, silylphosphines, silylboranes, etc.) in an amount up to about 20 at. % (or any maximum value less than about 25-30 at. %) with respect to the total number of atoms of silicon, germanium, and the dopant element. In some embodiments, the dopant source may have the formula $D_aR^1_b$, where a is 1 or 2; b is 3a, at least a instances of $R^1$ are $C_1$-$C_6$ alkyl, $C_6$-$C_{10}$ aryl, $C_7$-$C_{10}$ aralkyl or $AR^2_3$, where $R^2$ is hydrogen or $A_yH_{2y+1}$, A is Si or Ge, and $1 \leq y \leq 4$ (preferably y=1), and the remainder of the b instances of $R^1$ are independently H, $C_1$-$C_6$ alkyl, $C_6$-$C_{10}$ aryl, $C_7$-$C_{10}$ aralkyl or $AR^2_3$. In various implementations, the dopant has the formula $D(AH_3)_3$, where D is P or B, and A is Si or Ge.

The ink composition may contain suitable proportions of Group IVA semiconductor element precursor(s) (e.g., (poly)silanes, (poly)germanes, and/or (poly)germasilanes) and dopant source(s) to provide a desired doping level in the final film or feature. For example, from 0.00001 to about 20 vol. % (or any range of values therein, such as 0.001 to 10 vol. %) of the composition may consist essentially of the dopant source. Alternatively, the dopant source(s) may be present in an amount providing from about 0.0001 to about 10 at. % (or any range of values therein) of dopant atoms with respect to Si and/or Ge atoms in the Group IVA semiconductor element precursor(s). Dopant precursors, doped silane intermediates, doped silane compositions, doped semiconductor precursor inks, exemplary methods for their preparation, and techniques for determining and/or controlling the dopant levels in the precursor inks and active films are described in greater detail in U.S. Pat. Nos. 7,314,513, 7,674,926, and 7,879,696, and in co-pending U.S. patent application Ser. Nos. 11/249,167 and 11/867,587, respectively filed on Oct. 11, 2005 and Oct. 4, 2007, the relevant portions of each of which are incorporated herein by reference.

The liquid-phase (poly)silane ink may further comprise one or more conventional additives, such as a surface tension reducing agent, a surfactant, a binding agent, a thickening agent, a photosensitizer, etc. (see, e.g., U.S. patent application Ser. No. 12/243,880, filed on Oct. 1, 2008, the relevant portions of which are incorporated by reference herein). Preferably, however, the composition is free from components that may introduce atoms or other species (e.g., carbon, nitrogen, alkali metals, etc.) that may adversely affect the desired properties of a film or feature formed from the composition, particularly where such additional components include sufficiently high molar proportions of elements such as carbon, oxygen, sulphur, nitrogen, or halogens to adversely affect the desired properties of the resulting film or feature.

The (poly)silane ink may be deposited using any suitable method known in the art. For example, the liquid-phase ink may be blanket-deposited or coated on the substrate. In various embodiments, blanket deposition may comprise spin-coating, slit coating, slit die coating, extrusion coating, spray coating, or meniscus coating, or printing processes such as inkjet printing, gravure printing, flexographic printing, offset lithography, screen printing, slit coating, slit die coating, extrusion coating, pen coating, spray coating, meniscus coating, microspotting, stenciling, stamping, syringe dispensing, and/or pump dispensing the liquid-phase (poly)silane ink on the exposed crystalline, polycrystalline, or microcrystalline surface of the substrate.

Alternatively, the liquid-phase (poly)silane ink may be selectively deposited on the substrate by any printing technology known in the art. For example, printing may comprise inkjet printing, gravure printing, flexographic printing, offset lithography, screen printing, slit coating, slit die coating, extrusion coating, pen coating, spray coating, meniscus coating, microspotting, stenciling, stamping, syringe dispensing, and/or pump dispensing the liquid-phase (poly)silane ink in a predefined pattern onto the substrate surface. The coating and/or printing process may be conducted under an inert and/or reducing atmosphere. Thus, coating and/or printing may include purging an atmosphere in which the substrate is placed, then introducing an inert and/or reducing gas into the atmosphere, prior to coating and/or printing. In various embodiments, the inert and/or reducing gas may comprise He, Ar, $N_2$, etc., which may further comprise $H_2$, $NH_3$, $SiH_4$, and/or other source of gas-phase reducing agent (e.g., in an amount up to about 20 vol. %). The inert and/or reducing gas atmosphere may reduce any incidence of inadvertent and/or undesired oxide formation. In a preferred embodiment, the composition may be coated or printed under an inert atmosphere (preferably with $O_2$ levels <<1 ppm) to avoid unacceptably high oxygen content in the formed films or features, which may result in poor electrical properties. In one embodiment, the inert atmosphere consists essentially of Ar, and may further include less than 0.1 ppm $O_2$ and less than 100 ppm $N_2$.

Optionally, the liquid-phase ink composition may be irradiated (e.g., with light and/or actinic radiation) simultaneously with and/or immediately subsequent to depositing the liquid-phase ink on the exposed substrate surface. For example, in some embodiments, the liquid-phase (poly)silane ink may be irradiated with ultraviolet light having a wavelength (or wavelength band) shorter than 450 nm, preferably less than 400 nm, and most preferably less than 350 nm (e.g., within a range of 200 nm to 450 nm, such as 220 nm to 400 nm, or 250 to 350 nm, or any other range of values therein). While any form of radiation (and more particularly, any wavelength of light) may be used, the irradiating step preferably comprises irradiating with ultraviolet light. Such irradiation generally yields a film of cross-linked, oligomeric and/or polymeric hydrogenated (poly)silanes, which optionally can later be converted (e.g., by heating) into an amorphous hydrogenated semiconductor film or feature (e.g., an amorphous, hydrogenated silicon film) suitable for electronic devices, and which forms a microcrystalline and/or polycrystalline epitaxial film or feature upon further annealing, as described herein. Suitable sources for ultraviolet and non-ultraviolet radiation, exemplary radiation doses, and methods for irradiating a (poly)silane and/or cyclosilane ink are discussed in detail in co-pending U.S. patent application Ser. Nos. 12/114,741 and 12/243,880, respectively filed on May 2, 2008 and Oct. 1, 2008, the relevant portions of which are incorporated herein by reference.

In some embodiments, the deposited liquid-phase ink may be dried at a temperature for a length of time sufficient to remove substantially all of the remaining solvent(s) from the ink composition. In other embodiments, drying comprises removing the solvent(s) in a vacuum, with or without applied heat. Evaporating the solvent may comprise heating the coated or printed precursor composition (and/or substrate) to a temperature of from about 30° C. to about 200° C. (e.g., from 30° C. to about 90° C., from 80° C. to about 120° C., or any other range of values therein). The length of time may be sufficient to remove substantially all of the solvent and/or substantially all of the additive(s) from the coated or printed precursor ink (e.g., from 1 second to 4 hours, 1 minute to 120 minutes, or any other range of values therein). The vacuum may be from 1 mTorr to 300 Torr, 100 mTorr to 100 Torr, 1-20 Torr, or any other range of values therein, and may be applied by vacuum pump, aspirator, Venturi tube, etc. The solvent can be evaporated under an inert atmosphere with $O_2$ levels <<1 ppm to avoid unacceptably high oxygen content in the formed films or features.

Figure 4C:

Referring now to FIG. 4C, the method may further include a curing (e.g., heating) step to convert the dried, deposited (e.g., coated or printed) precursor to a semiconductor film 412. In the case of (poly)silanes, curing generally comprises heating the dried composition to a temperature of at least about 300° C. (preferably at least about 350° C., and more preferably at least about 400° C.) for a length of time sufficient to optionally convert the composition to an amorphous, hydrogenated film or feature comprising silicon and/or germanium. Such heating may be conducted for a length of time of at least 1 minute, 3 minutes, or 5 minutes.

In one exemplary embodiment, the Group IVA semiconductor element precursor (e.g., the (poly)silane, (poly)germane, and/or (poly)germasilane, or processed film or feature therefrom) is cured at a first temperature of from 50° C. to 200° C. (e.g., from 75° C. to 150° C., 100° C. to 125° C., or any other range of temperatures therein) for a length of time between 1 minute and 60 minutes (e.g., between 5 minutes and 30 minutes, 10 minutes and 20 minutes, or any other range of times therein). Optionally, the Group IVA semiconductor element precursor is further cured at a second temperature ranging from 300° C. to 600° C. (e.g., from 350° C. to 550° C., from 400° C. to 500° C., or any other range of temperatures therein) for a length of time between 1 minute and 60 minutes (e.g., between 5 minutes and 30 minutes, between 10 minutes and 20 minutes, or any other range of times therein) to form a continuous hydrogenated, amorphous Group IVA semiconductor element film 412. In various embodiments, the hydrogenated, amorphous Group IVA semiconductor element film 412 may be a patterned feature and/or may be doped. In each of the first and second curing steps, the temperature may be varied in order to optimize the (doped) Group IVA semiconductor element film or feature properties (e.g., density, purity, etc.).

Figure 4D:
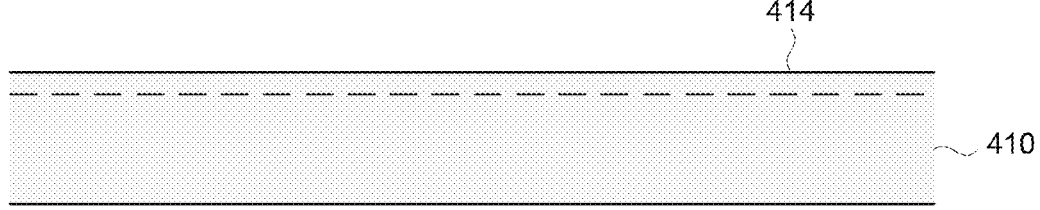

Referring now to FIG. 4D, the curing process may further comprise an annealing step, which may include heating the substrate 400 and the coated or printed Group IVA semiconductor element precursor film or feature 410, or the cured Group IVA semiconductor element film or feature 412 (e.g., the amorphous, hydrogenated film) at a temperature and for a length of time sufficient to provide the film or feature with certain predetermined or desired characteristics or qualities (e.g., conductivity, morphology, electromigration and/or etch resistance, stress and/or surface strain, etc.), and/or to activate any dopant(s) that are present in the film or feature. In one exemplary implementation, the Group IVA semiconductor element film or feature is heated to a temperature and for a length of time sufficient to form an epitaxial layer. Suitable annealing temperatures generally range from about 400° C. to about 1400° C., or any temperature or range of temperatures therein (e.g., from about 500° C. to about 800° C., etc.). In some embodiments, annealing may include one or more temperature ramps (e.g., stepped or continuous increases in temperature over predetermined periods of time). For example, the temperature ramp may include an increase of from 1° C. to 100° C. (or any range of temperatures therein), and the predetermined period(s) of time (which may be independently selected when the ramp includes two or more time periods for temperature increases) may be from 1 second to 1 hour (or any range of times therein). Suitable lengths of time for annealing may range from about 1 minute to about 2 hours, preferably from about 10 minutes to about 1 hour, or any range of times therein (e.g., from about 10 to about 30 minutes). Annealing may be conducted, optionally in an inert or reducing atmosphere, in a conventional furnace or oven, with flash lamp annealing, laser irradiation etc.

In exemplary embodiments, the substrate 400 and the deposited Group IVA semiconductor element precursor (e.g., 410 in FIG. 4B or 412 in FIG. 4C) is heated at a temperature and for a length of time sufficient for a film or feature 414 formed from the Group IVA semiconductor element precursor to adopt the crystalline structure of the exposed material at the surface 405 of the substrate 400. In some embodiments, the film or feature 410/412 is heated at a temperature above 400° C. (e.g., 500° C., 600° C., 800° C., 900° C., etc.) and for a length of time sufficient to form an epitaxial layer 414. In one example, the epitaxial structure (e.g., the combination of the substrate 400 and the at least partially crystallized film or feature 414) is larger in at least one dimension than before depositing the ink 410 (compare to, e.g., substrate 400 alone), but the newly formed material (e.g., 414) has the same crystalline structure as the substrate surface 405. Optionally, the Group IVA semiconductor element precursor can be annealed (e.g., epitaxially grown) without being cured (e.g., proceeding through an amorphous and/or hydrogenated stage).

Figure 5A:
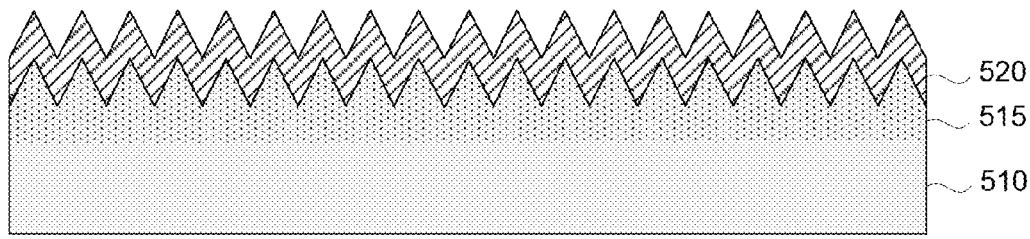
FIGS. 5A-5F are cross-sectional views of an exemplary method of forming an epitaxial structure according to embodiments of the present invention.

One exemplary method of forming an epitaxial structure 500 according to embodiments of the present invention is shown in FIGS. 5A-5D. In this variation, as shown in FIG. 5A, a liquid-phase (poly)silane ink as described herein is coated on the crystalline, polycrystalline or microcrystalline material 515 exposed on the substrate 510. Coating a doped (poly)silane ink allows for better control of doped film thickness than diffusion processes. In certain applications such as solar cell manufacturing, it is desirable to make the doped films as thin as possible for a given target conductivity, and coating a doped ink enables one to have control of the film thickness. The crystalline, polycrystalline or microcrystalline material 515 is exposed by any of the cleaning and/or etching methods discussed herein, before the coating of the (poly) silane ink. The exposed surface of crystalline, polycrystalline or microcrystalline material 515 in FIGS. 5A-D depicts a feature of certain solar cells sometimes known as "pyramid texturing," in which the surface is modified to reduce the reflection of light back into the environment, and hence, increase light absorption and, as a result, the power conversion efficiency of such solar cell. However, such surface modification is not required in the present invention.

In exemplary embodiments, the (poly)silane ink further comprises a dopant. The deposited (doped) (poly)silane, (poly)germane, and/or (poly)germasilane is then dried, cured, and/or annealed (e.g., by heating as described herein) to form a (doped) Group IVA semiconductor element film 520 on the substrate 510/515, which may be amorphous and/or hydrogenated. The (doped) Group IVA semiconductor element film 520 is heated at a temperature and for a length of time sufficient for the Group IVA semiconductor element film 520 to adopt the same crystalline structure as the crystalline, polycrystalline, or microcrystalline material 515 of the substrate surface (e.g., for epitaxial crystallization of the Group IVA semiconductor element film 520).

Figure 5B:
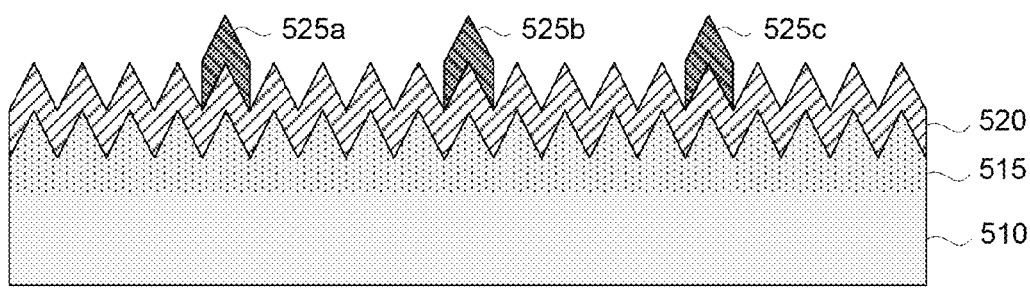
Figure 5C:
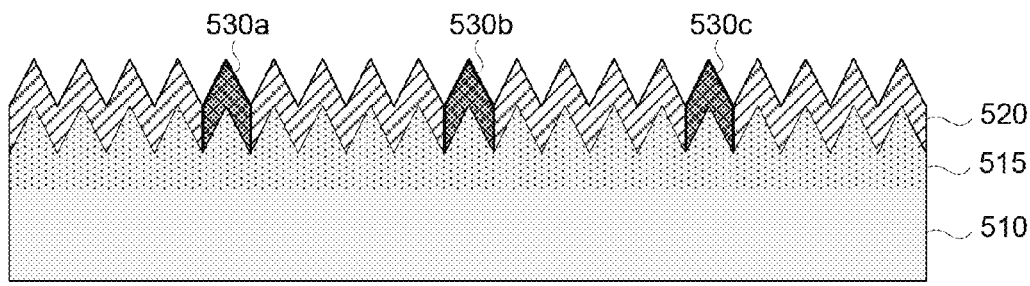

As shown in FIG. 5B, a second (poly)silane ink 525a-c containing a dopant (e.g., at a higher concentration than in the first coated ink) is printed onto the Group IVA semiconductor element film 520 in a predetermined pattern. In one embodiment, the second doped ink 525a-c is a dielectric- or polymer-based ink, and the dopant from the second ink 525a-c is then diffused into the Group IVA semiconductor element film 520 to form doped regions 530a-c, as shown in FIG. 5C. The dielectric or polymer-based ink 525a-c is subsequently removed from the structure, as shown in FIG. 5C.

In some implementations, the second doped ink 525a-c is a doped (poly)silane ink, the second doped ink 525a-c may comprise the same or different Group IVA semiconductor element precursor as that used to form film 520, in addition to the dopant and an optional solvent. In such embodiments, as shown in FIG. 5E, the doped Group IVA semiconductor element features 535a-c formed from the ink 525a-c can remain on the structure and become the highly doped region for epitaxial contacts. By forming a raised or three-dimensional pattern on the surface of the structure, the printed features 535a-c may also facilitate alignment of the subsequently deposited (e.g., printed) metal to the doped regions 535a-c. Printing the doped features 535a-c also avoids the possibility of outdiffusion from printed organic or dielectric dopant inks (see the paragraph immediately above), and the inadvertent doping of regions of the structure not intended to be doped. Printing a doped (poly)silane ink has the additional advantage of minimizing or eliminating outdiffusion of dopant and inadvertent contamination of adjacent areas (e.g., of the film 520) after forming the doped films 520 and features 535a-c (whether the films are epitaxial or not).

Figure 5D:
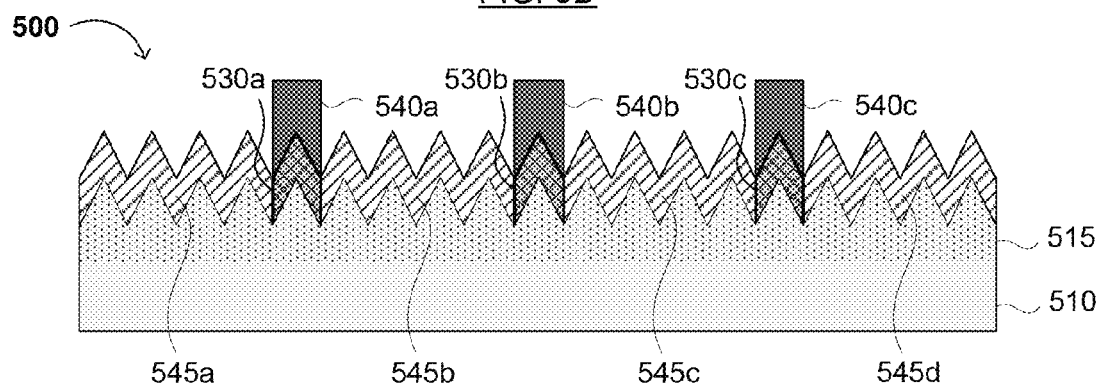
Figure 5E:
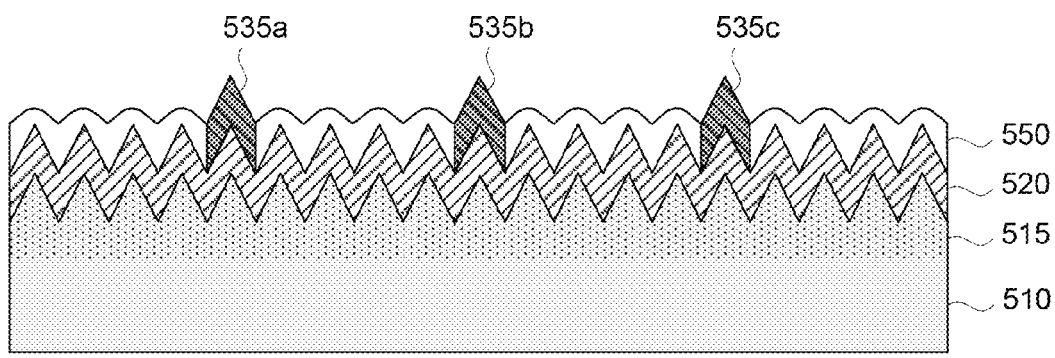

Referring now to FIG. 5D, one or more contacts 540a-c are formed in contact with (each of) the selectively doped regions 530a-c of the epitaxial structure 500. In certain embodiments, the resulting structure 500 has one or more very highly doped regions 530a-c (e.g., N++) in areas under and/or adjacent to the contacts 540a-c, relative to the regions 545a-d between the contacts 540a-c (which may be lightly or heavily [e.g., N+] doped).

The contacts 540a-c in FIG. 5D may comprise any metal or other material appropriate for forming ohmic contacts to a Group IVA semiconductor elemental conductor and/or semiconductor. Such metal contacts can be formed by printing an ink or paste comprising one or more metal precursors on the selectively doped regions 530a-c. In some embodiments, the metal precursor(s) may comprise one or more (organo)metallic compounds, (organo)metallic complexes, (organo)metallic clusters, metal nanoparticles, metal particles or flakes or a combination thereof. For example, the (organo)metallic compounds, complexes and clusters, as well as the metal nanoparticles, metal particles or flakes, may include known compounds, complexes, clusters, particles or flakes, and/or nanoparticles of metals such as aluminum, titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, silver, gold, zinc, cadmium, gallium, indium, thallium, tin, lead or bismuth, or a combination thereof. Alternatively, the ink may comprise or consist essentially of a conventional paste of one or more such metals or alloys or combinations thereof in a conventional binder and/or flux (e.g., suitable for screen printing). The metal ink may further include one or more passivating agents or other species included in or combined with such metal compounds, complexes, clusters and/or nanoparticles that are capable of providing an electrically active film upon further processing of the ink.

In some variations, the metal contacts can be formed by printing an ink comprising a salt, compound, cluster or complex of a silicide-forming metal (e.g., Ti, Ta, Cr, Mo, W, Ni, Co, Pd, or Pt), preferably a Group 6-12 silicide-forming metal (e.g., Mo, W, Ni, Co, Pd, or Pt), and more preferably a Group 9-10 silicide-forming metal (e.g., Ni, Co, Pd, or Pt). Such silicide-forming metal inks, methods of making silicide-forming metal inks, and methods for forming metal films and/or structures from such inks are described in detail in co-pending U.S. patent application Ser. Nos. 12/131,002 and 12/175,450, respectively filed on May 30, 2008 and Jul. 17, 2008, the relevant portions of each of which are incorporated by reference herein.

A metal-containing ink may be printed by essentially any printing technology discussed herein. For example, printing may comprise inkjet printing, gravure printing, flexographic printing, offset lithography, screen printing, slit coating, slit die coating, pen coating, meniscus coating, microspotting, stenciling, stamping, syringe dispensing, and/or pump dispensing the metal-containing ink in a predetermined pattern. The ink may comprise or consist essentially of the metal precursor material and a solvent, as described herein. In some variations, the metal contacts can be formed by electro(less) plating. In one example, plating may comprise printing a seed layer of metal (e.g., Pd, Ni, etc) using nanoparticles or an organometallic compound of the metal, and then selectively depositing (e.g., by electroless or electroplating) a bulk conductor (e.g., Ag, Al, Co, Ni, Cu, etc.) onto the printed seed layer.

Alternatively, in some implementations, the contacts may be formed by conventional metal deposition (e.g., conventional sputtering or evaporation) or coating of a liquid-phase ink as described herein (e.g., spin coating, extrusion coating, spray coating, etc.) and photolithography, by conventionally dispensing or printing a commercial metal paste, by conventional electro- or electroless plating onto a previously printed or patterned seed layer (see, e.g., U.S. patent application Ser. No. 12/131,002, filed on May 30, 2008, the relevant portions of which are incorporated by reference herein), or alternatively, by laser patterning techniques (see, e.g., U.S. patent application Ser. No. 11/203,563 filed on Aug. 11, 2005, the relevant portions of which are incorporated by reference herein). For example, deposition may include sputtering a relatively thin barrier and/or adhesive layer such as Ti, TiN or a TiN-on-Ti bilayer, then depositing a relatively thick bulk conductor layer, such as Al or Al—Cu alloy [0.5-4 wt. % Cu], followed by conventional photolithographic definition of contacts and metal features that are subsequently etched. Preferably, the metal is wet etched using a conventional $NH_4OH/H_2O_2$ etch composition that selectively etches metals such as Al, TiN and Ti. In other embodiments, the blanket depositing step may comprise spin-coating an ink containing the metal-containing material, in which the metal-containing material may comprise metal nanoparticles and/or organometallic precursors of one or more of the metals disclosed herein. In some implementations, the method may further comprise curing and/or annealing the metal, organometallic precursor(s) and/or metal nanoparticles under conditions (e.g., under an atmosphere [e.g., a reducing atmosphere], at a temperature and for a length of time) sufficient to form a conductive film.

In alternative embodiments, a metal precursor material layer may be coated or printed, and locally exposed to laser radiation such that it changes its solubility characteristics in the exposed areas. Upon washing away the unexposed area, the irradiated metal precursor stays behind to form a metal layer, optionally after an additional curing or annealing step (so-called "negative" patterning and developing). Alternatively, "positive" patterning and developing may be employed, in which the area exposed to radiation is washed away.

Laser patterning may further comprise the substeps of depositing a resist material on a blanket deposited metal-containing layer, selectively irradiating portions of the resist material with a beam of light from a laser having (i) a predetermined width and/or (ii) a predetermined wavelength or wavelength band absorbed by the resist (or by an absorptive dye in the resist), developing the selectively irradiated resist with a developer to leave a pattern corresponding to the structure being formed (note that these steps apply to both positive and negative resists), removing those portions of the blanket deposited material not corresponding to the desired or predetermined pattern (typically by dry or wet etching), and removing the remaining resist material (see co-pending U.S. patent application Ser. No. 11/203,563, filed on Aug. 11, 2005, the relevant portions of which are incorporated by reference herein). Preferably, the light has a wavelength in the infrared (IR) band (although it could also comprise a wavelength or wavelength band in the ultraviolet (UV) and/or visible band of the spectrum), the resist (or dye) absorbs and/or is sensitive to that wavelength or band of light, and the light beam is focused on or directed at the desired or predetermined portions of the resist.

Figure 5F:
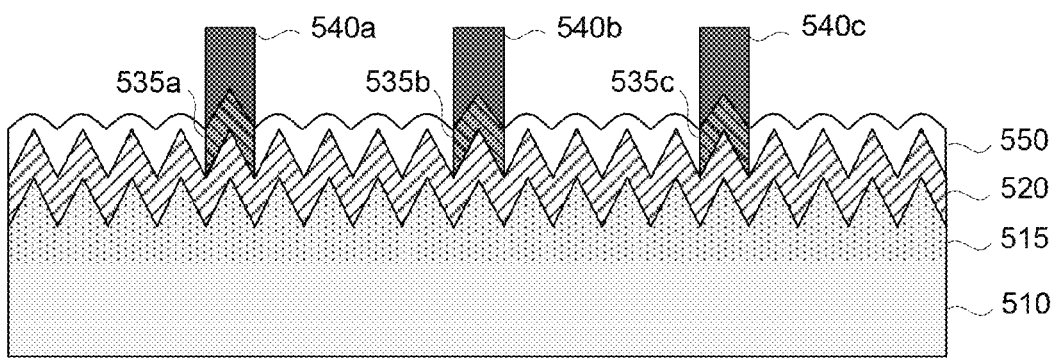

Referring back to FIG. 5E, an antireflective, dielectric and/or passivation coating 550 can be applied to the regions of film 520 between doped features 535a-c, by blanket deposition (e.g., sputtering, chemical vapor deposition [e.g., plasma-enhanced chemical vapor deposition (PECVD)], atomic layer deposition [ALD], etc.) or by printing or coating an ink containing an appropriate precursor. In the case of conventional blanket deposition or coating the ink, any residual antireflective material, dielectric or passivation remaining over the doped features 535a-c can be removed by a short etch process. The etch process can selectively remove the antireflective material, dielectric or passivation relative to the doped features 535a-c, or it can be nonselective. Alternatively, in various implementations, a conventional silicon nitride (SiN) antireflective coating (ARC) and/or a conventional oxide (e.g., $SiO_2$) passivation layer is deposited on the surface of the structure (e.g., the front surface, as shown), then the metal contacts are formed by screen printing a metal paste formulated to dissolve or etch through the dielectric (e.g., SiN and/or oxide) film(s) to make contact with the underlying doped features 535a-c. Thus, metal contacts 540a-c can be formed in contact with the doped features 535a-c as shown in FIG. 5F.

Another exemplary method for forming an epitaxial structure 600 similar to or substantially the same as the epitaxial structure 500 shown in FIG. 5D is shown in FIGS. 6A-6D. In this embodiment, and substantially as described above with regard to FIG. 5A, in FIG. 6A, a liquid-phase (doped) (poly) silane ink is blanket-deposited (e.g., by coating, printing etc.) on the crystalline, polycrystalline, or microcrystalline material 615 exposed on the surface of the substrate 610. The liquid-phase (poly)silane ink is then heated at a temperature and for a length of time sufficient for a film 620 formed from the (poly)silane, (poly)germane, and/or (poly)germasilane to adopt a crystalline structure of the material 615, as described herein.

Figure 6A:
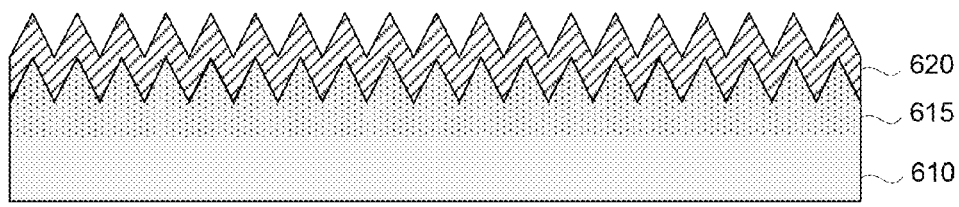
FIGS. 6A-6D are cross-sectional views of an exemplary method of forming an epitaxial structure according to embodiments of the present invention.
Figure 6B:
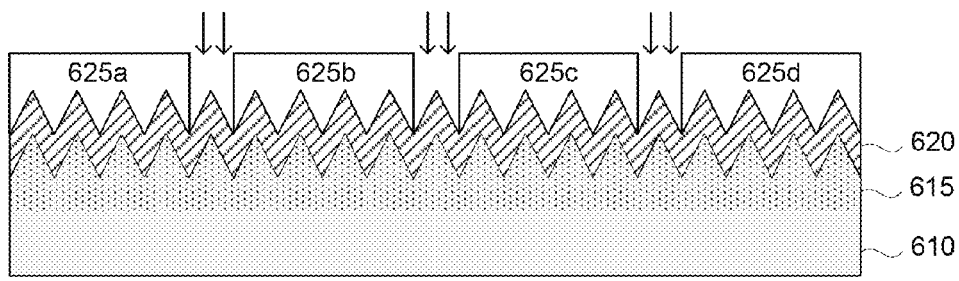
Figure 6C:
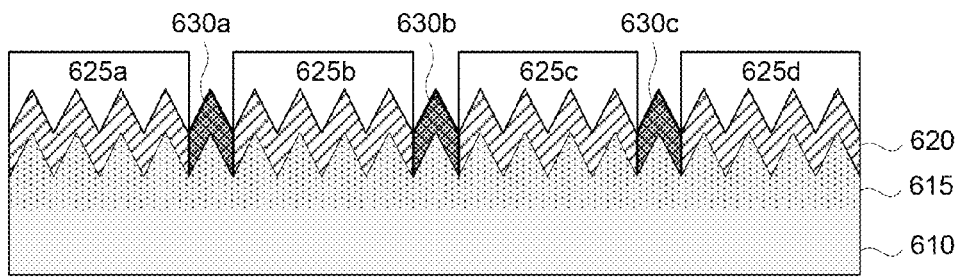

A patterned mask 625a-d is then formed on the film 620, as shown in FIG. 6B. The patterned mask 625a-d may comprise a conventional photoresist or a dielectric and be formed using any suitable method known in the art (e.g., conventional deposition and photolithographic processes, printing, laser ablation etc.). A dopant is then introduced into regions of the film 620 not covered by the patterned mask 625a-d (e.g., by implantation, gas phase diffusion [e.g., a POCL process, etc.], printing of a dopant source etc.) to form doped regions 630a-c, as shown in FIG. 6C. Thus, the resulting structure has one or more regions 630a-c in areas not covered by the mask 625a-d that are more highly doped than the covered regions of film 620 where the dopant was not introduced. Alternatively, a solar cell architecture can be made that has local contacts on the backside. In fact, both n- and p-contacts may be formed on the backside, and no contacts made on the front side (a so-called "backcontact" cell). Also, both the front and backside of the cell may have local contacts. For either design, the local contacts may be made by the method(s) disclosed herein for forming a doped semiconductor film or a heavily doped semiconductor feature (e.g., printing directly on an exposed crystalline, polycrystalline or multicrystalline material, or diffusing a dopant through a mask [e.g., a dielectric]). Thus, local epitaxial contacts can be made on the front and/or backside of the substrate, and such local epitaxial contacts may be N+ or N++ only, P+ or P++ only, or a combination thereof (e.g., N+ and P+).

Figure 6D:
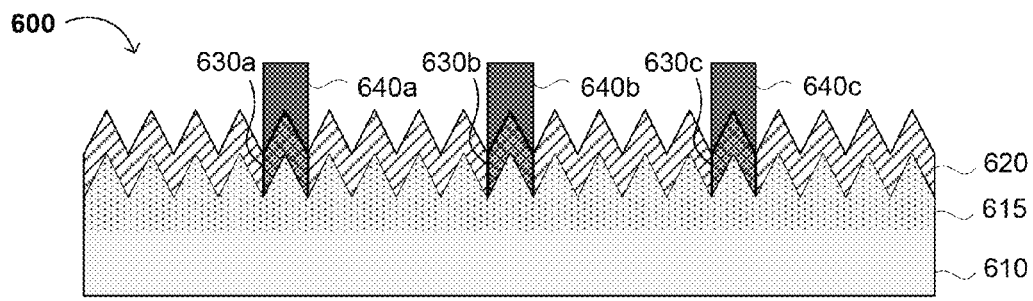

As shown in FIG. 6D, and optionally after removing the patterned mask 625a-d, metal contacts 640a-c may then be formed on or adjacent to one or more doped regions 630a-c using any suitable material(s) and/or method(s) described herein (e.g., as described with regard to FIG. 5D). The resulting structure 600 has one or more highly doped regions 630a-c in areas contacting the metallization 640a-c relative to the regions of the film 620 between the metal contacts 640a-c.

Figure 7A:
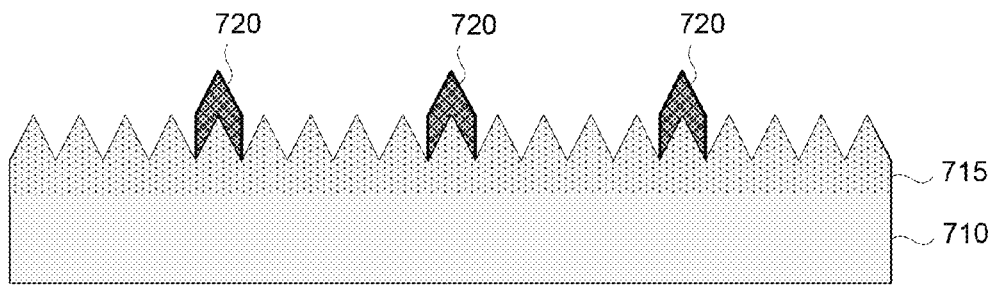
FIGS. 7A-7C are cross-sectional views of an exemplary method of forming an epitaxial structure by printing in accordance with embodiments of the present invention.
Figure 7B:
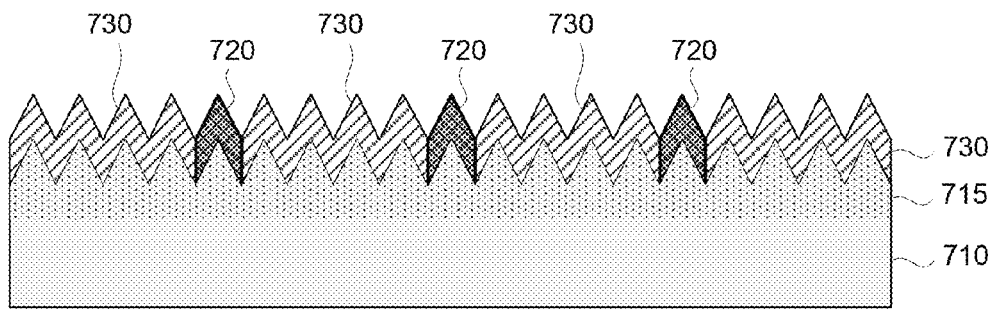
Figure 7C:
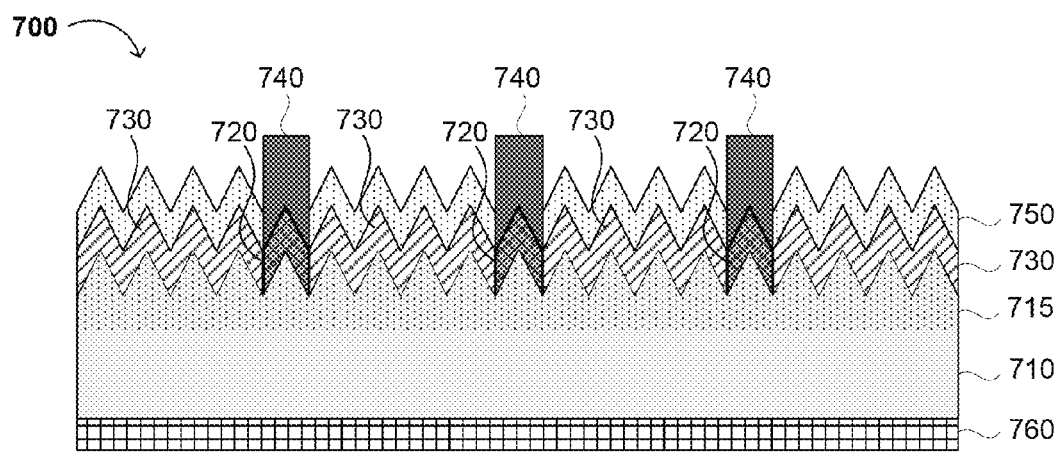

Another method for forming an epitaxial structure 700 according to embodiments of the present invention is shown in FIGS. 7A-7C. In FIG. 7A, a (heavily) doped liquid-phase (poly)silane ink as described herein is selectively deposited on the crystalline, polycrystalline, or microcrystalline material 715 on the surface of substrate 710 by printing (e.g., ink jet printing, gravure printing, screen printing, slit coating, slit die coating, etc.) the ink in a predetermined pattern to form (heavily) doped features 720. In exemplary embodiments, the Group IVA semiconductor element precursor contains one or more dopant atoms as described herein, preferably in an amount providing a heavily-doped (e.g., N++) (patterned) semiconductor film or feature. Generally, the doped liquid-phase (poly)silane ink is dried, optionally cured and annealed to form a patterned, doped epitaxial Group IVA semiconductor element feature 720, although curing and annealing can be conducted after one or more additional inks are deposited onto the surface material 715 of the substrate 710.

Referring to FIG. 7B, a second ink (e.g., a (poly)silane ink containing the same or different Group IVA semiconductor element precursor and/or the same or different dopant as the first ink) is deposited on the crystalline, polycrystalline, or microcrystalline material 715 in regions other than where the first doped Group IVA semiconductor element pattern 720 was formed. In preferred embodiments, the second ink comprises a dopant in a concentration that is less than that of the first liquid-phase ink, preferably in an amount providing a doped (e.g., N or N+) semiconductor film. When two inks with different dopant levels are printed to form features 720 and film 730, respectively, curing and/or annealing of the features 720 and film 730 can optionally be performed simultaneously. Thus, as described in detail herein, the printed ink(s) are then heated at a temperature and for a length of time sufficient for features 720 and/or film 730 formed from the (poly)silane inks to adopt a crystalline structure of the exposed crystalline, polycrystalline, or microcrystalline material 715 of the substrate 710 (e.g., to form an epitaxial layer on the substrate).

As shown in FIG. 7C, an anti-reflective coating and/or surface passivation film 750 may be formed on the film 730 (and, optionally, on features 720), and one or more contacts 740 can then be formed on or adjacent to the relatively highly doped features 720 using one or more materials and/or methods as described herein with regard to FIGS. 5D and/or 6D. In implementations in which the anti-reflective coating 750 is formed on the features 720, the metal ink may be formulated such that it etches through the anti-reflective coating 750 (e.g., after deposition or during a high-temperature curing step). Alternatively, the anti-reflective coating 750 can be selectively or non-selectively deposited on the exposed regions of the film 730 after the metal contacts 740 are formed.

In the embodiment of FIG. 7C, one or more back (or backside) contacts 760 (e.g., P+, P++, N+ or N++ films) may be formed on the underside of the substrate 710. Such additional features (e.g., the anti-reflective coating and/or surface passivation layer 750 and/or the back contact 760) may be formed using any suitable method known in the art (e.g., blanket deposition, PVD, CVD, ALD, coating, printing and etching, printing, etc.) or as described elsewhere herein. In one embodiment, a global contact such as back contact 760 in FIG. 7C (or back contact 860 in FIG. 8) can be formed by applying or depositing a metal paste (e.g., an aluminum paste) that may further include a dopant or dopant precursor and that diffuses into the substrate 710 and forms the contact layer 760. Although these additional features (e.g., anti-reflective coating 750 and/or back contact 760) are not necessarily shown in FIGS. 5A-5F and FIGS. 6A-6D, such features can be formed in the embodiments of FIGS. 5A-5F and FIGS. 6A-6D in accordance with the description herein.

In some implementations, the dopant may be selectively introduced to desired areas of the exposed crystalline surface of the substrate 710 (e.g., regions of film 620 in FIG. 6B exposed by mask 625) by gas-phase diffusion (e.g., a POCl process, etc.). In such a process, a glassy deposit or film containing the dopant species may form on the exposed surface of the substrate 710. The dopant is then driven into the Group IVA semiconductor element film (e.g., 620 in FIG. 6B) or substrate (e.g., 710 in FIG. 7C) via a high-temperature diffusion process. After the dopant is diffused into the substrate, the glassy film formed during the gas-phase diffusion process is subsequently removed (e.g., by an oxide etching process). In general, the gas-phase diffusion process includes a cleaning or etching step to remove any residue from the surface(s) of the structure.

Thus, in one alternative embodiment, the structure of FIG. 7A is exposed to a gas-phase dopant species (e.g., $POCl_3$) via a conventional gas phase diffusion process (e.g., a POCl process, etc.). The structure of this process equivalent to that of FIG. 7B looks like FIG. 7A, but the doped part of surface material 715 (indicated by dots) is only in the areas between the printed contacts 720.

The advantages of printed, doped (poly)silane inks compared to conventional doping processes include:
  Avoiding any cleaning step to remove residue from the surface of the structure following doping (e.g., as is necessitated by the POCl process outlined above). Using a printed, doped (poly)silane ink, the doped (epitaxial) layer becomes part of the substrate and can be left in place.

Coating processes allow for better control of film thickness than diffusion processes. In certain applications such as solar cell manufacturing, it is desirable to make the doped layers as thin as possible, as long as the conductivity is high enough for the application. Hence, embodiments in which a doped (poly)silane ink is coated on the substrate to form an unpatterned, epitaxial doped silicon film should be quite beneficial compared to conventional doping processes, such as the POCl process, laser doping, etc.

Exemplary Structures

Aspects of the present invention also relate to exemplary structures generally comprising (a) a substrate having a surface, the surface having an exposed crystalline, polycrystalline or microcrystalline material (e.g., in the absence of an overlying material); (b) a film or feature comprising a Group IVA semiconductor element on the crystalline, polycrystalline or microcrystalline material, the film or feature having (i) a crystalline structure of the exposed material, and (ii) a first doped region; and (c) one or more contacts on the first doped region of the film or feature. In exemplary embodiments, the Group IVA semiconductor element film or feature comprises a second doped region in areas not under the contacts. In such embodiments, the first doped region under the contact(s) has a higher dopant concentration than the second doped region not under the contact(s). The structures of the present invention may be beneficial for use in photovoltaic devices (e.g., solar cell architectures such as conventional N+/P/P+ cells with and without selective emitter[s] [e.g., features 535*a-c* in FIG. 5E, features 630*a-c* in FIG. 6C, and features 720 in FIG. 7B], solar cells based on N-type wafers [e.g., P+/N/N+ cells], solar cells including localized P+ and N+ contacts on the backside of the substrate, etc.), light sensors, image sensors, light emitting devices, and/or MEMS devices.

Figure 8:
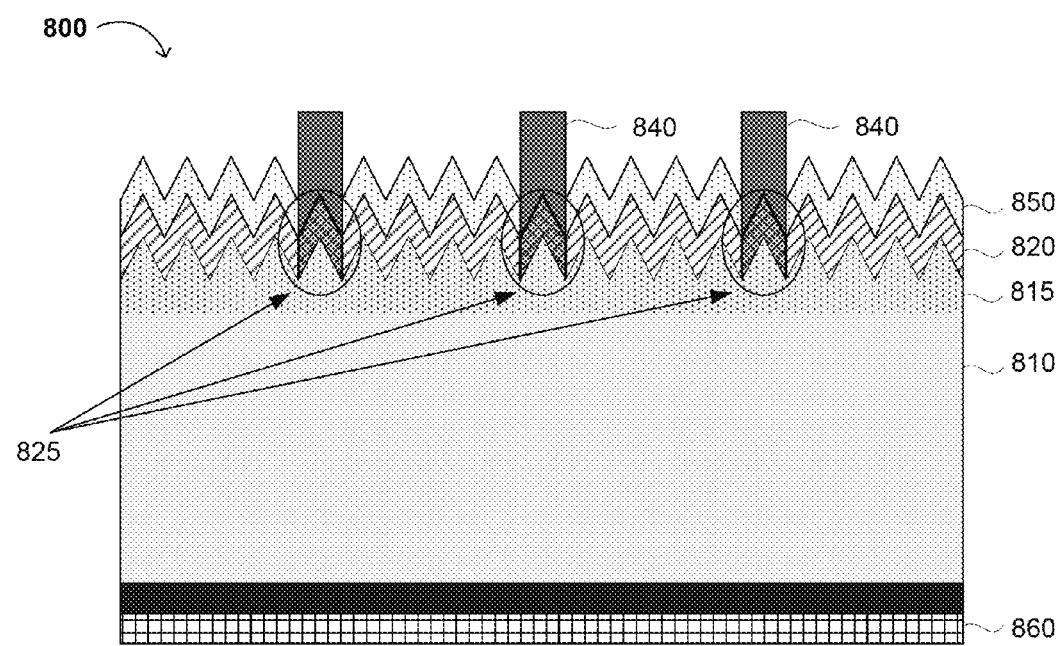
FIG. 8 is a cross-sectional view of an exemplary structure according to embodiments of the present invention.

An exemplary structure 800 according to embodiments of the present invention is shown in FIG. 8. As discussed above with regard to exemplary methods of forming epitaxial structures, the substrate 810 may comprise any suitable Group IVA element-containing support structure having a surface that exposes a crystalline, polycrystalline, or microcrystalline material 815. In exemplary embodiments, the substrate comprises a polycrystalline wafer, a multi-crystalline wafer, a metallurgical-grade wafer, a ribbon or a band consisting essentially of a Group IVA semiconductor element (which may be the same or different Group IVA element as the epitaxial film), a ceramic substrate (as described herein), or a porous silicon substrate. Preferably, the substrate comprises an exposed (e.g., cleaned and/or etched) crystalline or polycrystalline material 815. In some variations, one or more single crystalline or polycrystalline thin films are on the surface of a conductive or non-conductive substrate (e.g., as described above with regard to exemplary methods of forming epitaxial structures; see also FIGS. 4B and 4C). In embodiments including a backside contact 860, the substrate preferably comprises a "self-standing" silicon substrate (e.g., a silicon wafer, silicon ribbon, etc.). In exemplary embodiments, the crystalline, polycrystalline, or microcrystalline material exposed on the surface of the substrate has a thickness less than 100 μm, or in some embodiments, less than 50 μm. In some instances, the substrate 810 may comprise a doped wafer, such as a P-type or N-type single-crystalline, multi-crystalline etc. silicon wafer.

Referring again to FIG. 8, the structures of the present invention include at least one feature 820 and/or 825 on the cleaned and/or etched crystalline, polycrystalline, or microcrystalline surface of the substrate 815/810. In exemplary embodiments, the film or feature 820/825 comprises a Group IVA semiconductor element (e.g., Si and/or Ge) and at least one dopant. Furthermore, the film or feature 820/825 preferably has the same crystalline structure of the exposed crystalline, polycrystalline, or microcrystalline material 815 on the substrate surface. Alternatively, some embodiments of the invention use a doped (poly)silane ink to make a patterned or unpatterned doped epitaxial layer by coating and curing/annealing as discussed above with respect to FIG. 5A, as an alternative to conventional doping processes (e.g., the POCl process, implantation, etc.). Fabrication of a solar cell utilizing such an embodiment may not include a selective emitter 825, but instead, may follow a conventional solar cell fabrication and design scheme as depicted in FIG. 1A, in which the layer 120 may be formed by coating or printing a doped (poly)silane ink onto substrate surface 110 and subsequently curing and/or annealing the coated or printed (poly)silane to form an epitaxial layer 120. Subsequent surface passivation, antireflective coating formation, and/or metallization may be implemented by conventional techniques, as are known in the art.

The Group IVA semiconductor element film or feature preferably includes one or more dopants selected from the group consisting of boron, phosphorous, arsenic, and antimony. Suitable dopants are described in detail above with regard to exemplary methods of forming epitaxial structures. In exemplary embodiments, the Group IVA semiconductor element film or feature includes a first doped region 825 and a second doped region 820. Preferably, the first doped region 825 has a high dopant concentration (e.g., a very highly doped region such as an N++ region) relative to the dopant concentration of the second doped region 820 (e.g., a highly doped, or N+, region).

Referring still to FIG. 8, the structure 800 generally comprises one or more contacts 840, preferably on the first doped region 825 of the Group IVA semiconductor film or feature. The contacts 840 may have any suitable shape and/or size, and may comprise any metal or other conductive material suitable for ohmic contacts to a doped Group IVA semiconductor. For example, the contacts may comprise a metal selected from the group consisting of Zr, Hf, V, Nb, Ta, Cr, Mo, W, Mn, Re, Fe, Ru, Os, Co, Rh, Ir, Ni, Pd, Pt, Cu, Ag, Au, Zn, Cd, Al, Ti, Ga, In, Sn, Pb, Bi, and combinations thereof. In some variations, the contacts may comprise a silicide-forming metal (e.g., Ti, Ta, Cr, Mo, W, Ni, Co, Pd, or Pt), and a metal silicide (e.g. of the silicide-forming metal) between the silicide-forming metal and the doped region 820. In addition, the structure 800 of the present invention may further include one or more back or backside contacts 860 on the underside of the substrate 810. The backside contacts 860 may comprise any of the conductive materials described herein (e.g. a conventional aluminum paste for backside metallization, etc.).

In some implementations, the structure 800 may include an anti-reflective coating 850. The anti-reflective coating 850 may comprise an inorganic insulator, such as silicon oxide, silicon nitride, silicon oxynitride, alumina, titania, germania ($GeO_2$), hafnia, zirconia, ceria, one or more other metal oxides, or a combination and/or nanolaminate thereof. The anti-reflective coating 850 may have a thickness of from 50 Å to 100,000 Å (e.g., 50 to 200 Å, or any other range of values therein). In one embodiment, the antireflective coating comprises a layer of silicon nitride.

The selective epitaxial contacts and structures of the present invention may be used in various devices and applications such as light sensors, image sensors, light emitting devices, MEMS devices, analog devices and circuits, etc., as well as photovoltaic devices, including solar cell architectures such as conventional N+/P/P+ cells, cells based on N-type wafers (P+/N/N+ cells), back contact cells, front emitter wrap through cells, etc.

Experimental Results

A number of silicon films were formed on single-crystalline (100) Si substrates by coating a polysilane ink as described in U.S. Pat. No. 7,485,691 and crystallized by rapid thermal annealing (RTA). In one example, a silicon film having a thickness of 223 nm was formed on a Si wafer (100). The Si wafer was split in 4 quarters, and each quarter was annealed for 1 minute at a different temperature (700° C., 750° C., 800° C., or 850° C.) to form Samples 1-1, 1-2, 1-3, and 1-4. In another example, a silicon film having a thickness of 220 nm was formed on a Si wafer (100) and annealed for 1 minute at 800° C. to form Sample 2. The silicon films were characterized by x-ray diffraction (XRD) using a Bruker axs x-ray diffractometer, and the film thicknesses were measured using a Tencor profilometer.

Figure 9:
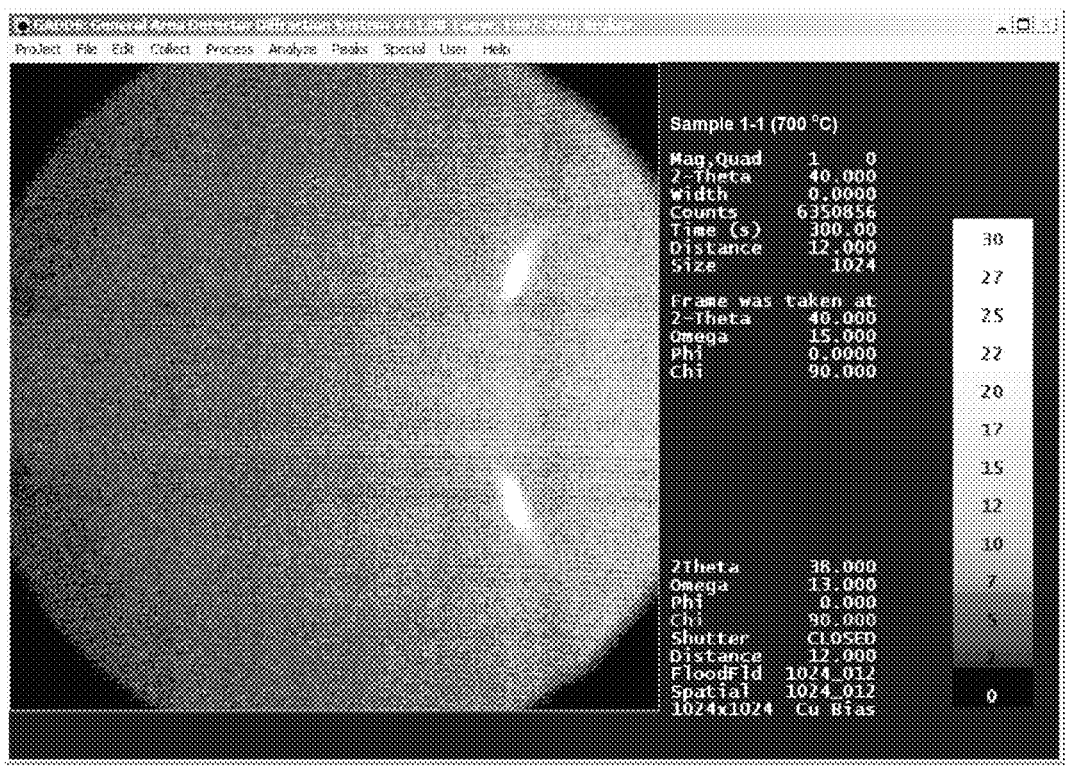
FIG. 9 is a two-dimensional diffraction map of a first exemplary silicon film sample made in accordance with the present invention.
Figure 10:
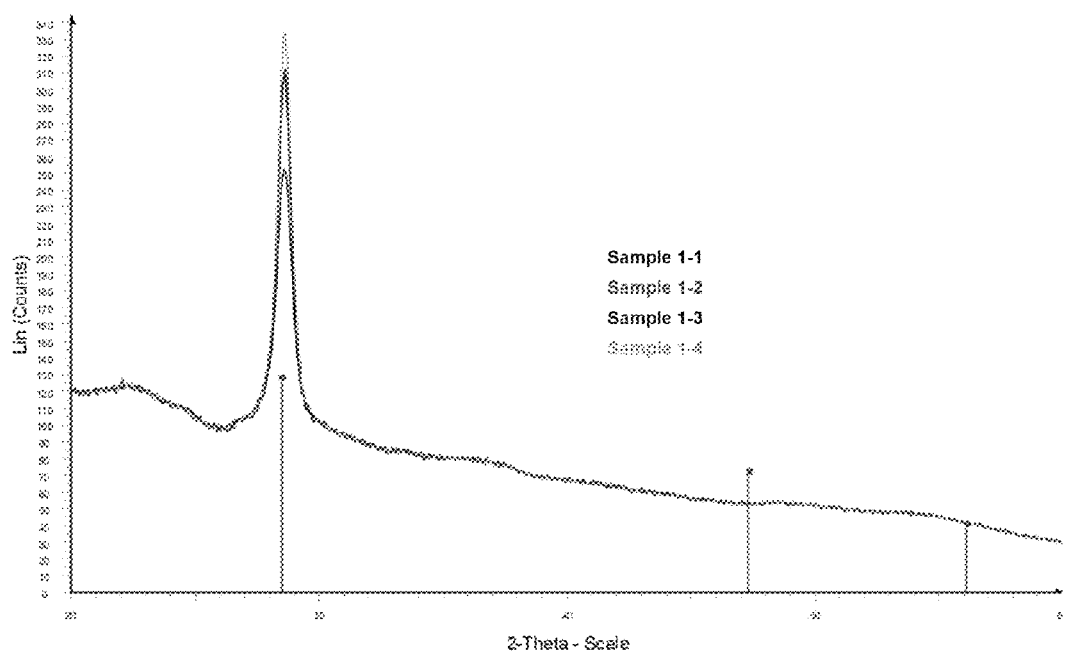
FIG. 10 shows x-ray diffraction results for four exemplary silicon film samples made in accordance with the present invention.

A diffraction map showing the silicon film of Sample 1-1 (annealed at 700° C.), displayed on a Bruker General Area Detector Diffraction System, is shown in FIG. 9. FIG. 10 shows the x-ray diffraction results for Samples 1-1 through 1-4.

The silicon films formed from polysilane inks crystallize epitaxially on Si (100) wafers after annealing at 700° C. or higher, as evidenced by the observation of a single x-ray peak corresponding to the Si (111) lattice planes at 2Theta=28.5° and the lack of expected peaks for polycrystalline silicon at ~47° and ~56° (indicated by the vertical red peak position indicators). The silicon films are single crystalline, although they appear to show twinning. The quality of the crystallization (as reflected by the value along the y-axis of the graph in FIG. 10 relative to the baseline) is proportional to the annealing temperature.

In a further experiment, single crystalline silicon <100> wafers were coated with a polysilane ink as described in U.S. Pat. No. 7,485,691 and crystallized at 850° C. to form a silicon film, either in a furnace or by RTA. The silicon films were characterized by x-ray diffraction (XRD) using the Bruker axs x-ray diffractometer. Experimental parameters and results are shown below in Table 1. Samples indicated as "shock" were inserted into the furnace at 850° C. instead of 450° C., and the heating temperature of those samples indicated as "pyrometer" was controlled by a pyrometer, instead of thermocouple.

TABLE 1

Crystallinity of silicon films from polysilane inks on silicon wafers, with or without a surface oxide.

| Substrate | Clean | Oven | Temperature | Time | Notes | Crystallinity |
|---|---|---|---|---|---|---|
| tOx | None | Furnace | 850° C. | 2 hr | | Poly |
| tOx | None | Furnace | 850° C. | 2 hr | Shock | Poly |
| tOx | None | Furnace | 850° C. | Overnight | | Poly |
| tOx | None | RTA | 850° C. | 1 min | | Poly |
| tOx | None | RTA | 850° C. | 1 min | Slow Ramp | Poly |
| tOx | None | RTA | 850° C. | 1 min | Pyrometer | Poly |
| Si | None | Furnace | 850° C. | 2 hr | | Poly |
| Si | None | Furnace | 850° C. | 2 hr | Shock | Poly |
| Si | None | Furnace | 850° C. | Overnight | | Poly |
| Si | None | RTA | 850° C. | 1 min | | Poly |
| Si | None | RTA | 850° C. | 1 min | Slow Ramp | Poly |
| Si | None | RTA | 850° C. | 1 min | Pyrometer | Poly |
| Si | BOE | Furnace | 850° C. | 2 hr | | Single Crystal |
| Si | BOE | Furnace | 850° C. | 2 hr | Shock | Single Crystal |
| Si | BOE | Furnace | 850° C. | Overnight | | Single Crystal |
| Si | BOE | RTA | 850° C. | 1 min | | Single Crystal |
| Si | BOE | RTA | 850° C. | 1 min | Slow Ramp | Single Crystal |
| Si | BOE | RTA | 850° C. | 1 min | Pyrometer | Single Crystal |
| Si | BOE | n/a | n/a | n/a | No anneal | Amorphous |

As shown by the results in Table 1, silicon films on oxides (thermal or native) formed from polysilane inks are polycrystalline. Silicon films on silicon wafers that are treated with a standard buffered oxide etch (BOE) solution prior to coating with a polysilane ink are single crystalline. This shows that silicon films can be formed or grown on a clean surface of crystalline silicon by epitaxial crystallization. The samples in Table 1 that were annealed by RTA showed <111> and <220> reflections, in addition to substrate reflections. Samples that were shock furnace annealed or slow RTA annealed did not show any additional reflections.

In still further experimentation, a polysilane ink as described in U.S. Pat. No. 7,485,691 was coated onto single crystal <100> and <111> silicon wafers, and crystallized at 850° C. in a furnace or by RTA to form a silicon film. The silicon films were characterized by x-ray diffraction (XRD) using the Bruker axs x-ray diffractometer. Experimental parameters and results are shown below in Table 2.

TABLE 2

XRD reflections of silicon films from polysilane inks on <100> and <111> silicon wafers.

| Substrate | Oven | Temperature | Time | XRD Reflections |
|---|---|---|---|---|
| <100> | Furnace | 850° C. | 2 hr | 311, 400, 511 |
| <100> | RTA | 850° C. | 1 min | 311, 400, 511 |
| <111> | Furnace | 850° C. | 2 hr | 111, 222, 331, 422 |
| <111> | RTA | 850° C. | 1 min | 111, 222, 331, 422 |

As shown by the results in Table 2, silicon films crystallize epitaxially from polysilane inks on both <100> and <111> silicon wafers. The silicon films formed from polysilane inks show the same reflections as the substrates. There is no observed difference between silicon films crystallized by furnace annealing or by RTA annealing.

CONCLUSION/SUMMARY

Thus, the present invention provides epitaxial films and structures, methods of making epitaxial structures, and devices incorporating such epitaxial structures. Forming epitaxial contacts and structures from semiconductor films or features made using a liquid-phase Group IVA semiconductor element precursor ink (e.g., comprising a (poly)silane, a (poly)germane, and/or a (poly)germasilane) may be beneficial because a relatively good film is formed in terms of smoothness, density, and purity, particularly when compared to films formed from nanoparticle-based inks. Due to the improved film quality, devices or cells (e.g., solar cells, light sensors, image sensors, etc.) incorporating a selective emitter made from a (poly)silane ink may exhibit improved power conversion efficiency relative to a device or cell having a selective emitter made from silicon nanoparticles.

In addition, the liquid-phase (poly)silane inks described herein form epitaxial films or features when the ink is deposited on a substrate having a cleaned or etched (poly)crystalline surface and is heated sufficiently for the film or feature formed from the Group IVA semiconductor element precursor to adopt the same crystalline structure of the exposed material on the substrate surface (e.g., an epitaxial film). The epitaxial films or features can be useful for emitter contacts, collector contacts, source/drain contacts, and/or other ohmic contacts. The present epitaxial film(s) or feature(s) may be useful in photovoltaic devices, light sensors, image sensors, light emitting devices, MEMS devices, or thin film transistors because they may substantially eliminate an interface between the film or feature and an underlying and/or adjacent material. When incorporated into a photovoltaic device, the present epitaxial film(s) or feature(s) may provide improved power conversion efficiency due to the perfect interface formed in the regions between the epitaxial film or feature and the (semi)conductive material on which the epitaxial film or feature is formed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of forming an epitaxial structure comprising:
   a) cleaning or etching a surface of a substrate, the surface having an exposed crystalline, polycrystalline or microcrystalline material after the cleaning or etching;
   b) depositing a liquid-phase ink on the crystalline, polycrystalline or microcrystalline material by printing or coating, the liquid-phase ink comprising a (poly)silane, a (poly)germane, and/or a (poly)germasilane; and
   c) heating the (poly)silane, (poly)germane, and/or (poly)germasilane at a temperature and for a length of time sufficient for a film or feature formed from the (poly)silane, (poly)germane, and/or (poly)germasilane to adopt a crystalline structure of the exposed material.

2. The method of claim 1, wherein the film or feature is heated to a temperature above 400° C. and the length of time is sufficient to form an epitaxial layer.

3. The method of claim 2, wherein the film or feature is heated to a temperature above 600° C. and the length of time is sufficient to form an epitaxial layer.

4. The method of claim 1, further comprising heating the (poly)silane, (poly)germane, and/or (poly)germasilane at a first temperature of from 50° C. to 200° C. for a length of time between 1 minute and 60 minutes.

5. The method of claim 4, further comprising curing the (poly)silane, (poly)germane, and/or (poly)germasilane at a second temperature of from 300° C. to 600° C. for a length of time between 1 minute and 60 minutes, thereby forming a hydrogenated, amorphous Group IVA semiconductor element film or feature.

6. The method of claim 1, wherein cleaning or etching the surface of the substrate comprises sputter etching or plasma etching the surface of the substrate.

7. The method of claim 1, wherein cleaning or etching the surface of the substrate comprises etching the substrate with a liquid- or vapor-based etchant.

8. The method of claim 1, wherein the liquid-phase ink is printed or coated by inkjet printing, gravure printing, flexographic printing, offset lithography, screen printing, slit coating, slit die coating, spin coating, extrusion coating, pen coating, or spray coating.

9. The method of claim 1, further comprising irradiating the liquid-phase ink with actinic radiation, simultaneously with and/or immediately subsequent to depositing the liquid-phase ink on the substrate.

10. The method of claim 1, wherein the ink further comprises one or more dopants selected from the group consisting of boron, phosphorous, arsenic, and antimony.

11. The method of claim 10, wherein the liquid-phase ink is printed on the crystalline, polycrystalline or microcrystalline material in a predetermined pattern.

12. The method of claim 11, further comprising depositing a second ink on the substrate in regions other than where the liquid-phase ink is selectively deposited, the second ink having a dopant concentration less than that of the liquid-phase ink.

13. The method of claim 1, wherein the liquid-phase ink is blanket-deposited on the crystalline, polycrystalline or microcrystalline material.

14. The method of claim 13, further comprising:
   a) printing a dopant ink in a predetermined pattern onto the film, and diffusing a dopant from the dopant ink into the film; or
   b) printing a doped ink in a predetermined pattern onto the film, the doped ink comprising the same or different precursor of the same or different Group IVA element and a dopant; or
   c) forming a patterned mask on the film, and diffusing or implanting a dopant into regions of the film not covered by the patterned mask.

15. The method of claim 1, wherein the substrate comprises a single-crystalline wafer, a polycrystalline wafer, a multi-crystalline wafer, a metallurgical-grade wafer, a ribbon or a band consisting essentially of the same or different Group IVA semiconductor element as the film or feature.

16. The method of claim 1, wherein the substrate comprises a ceramic substrate or a porous silicon substrate.

17. A structure, comprising:
   a) a substrate having a surface, the surface having an exposed crystalline, polycrystalline or microcrystalline material in the absence of an overlying material;
   b) a film or feature comprising a Group IVA semiconductor element on the crystalline, polycrystalline or microcrystalline material, the film or feature having (i) a crystalline structure of the exposed material, and (ii) a first doped region; and
   c) one or more contacts on the first doped region of the film or feature.

18. The structure of claim 17, wherein the substrate comprises a single-crystalline wafer, a polycrystalline wafer, a multi-crystalline wafer, a metallurgical-grade wafer, a ribbon or a band consisting essentially of the same or different Group IVA semiconductor element as the film or feature.

19. The structure of claim 17, wherein the substrate comprises a ceramic substrate or a porous silicon substrate.

20. The structure of claim 17, wherein the substrate comprises an exposed crystalline or polycrystalline material.

21. The structure of claim 20, wherein the crystalline or polycrystalline material has a thickness of less than 100 μm.

22. The structure of claim 17, wherein the Group IVA element comprises silicon and/or germanium.

23. The structure of claim 22, wherein the film or feature comprises one or more dopants selected from the group consisting of boron, phosphorous, arsenic, and antimony.

24. The structure of claim 17, wherein the first region has a relatively high dopant concentration, and a second region of the film or feature not under the contact has a relatively low dopant concentration.

25. The structure of claim 17, wherein the one or more contacts comprise a metal selected from the group consisting of Zr, Hf, V, Nb, Ta, Cr, Mo, W, Mn, Re, Fe, Ru, Os, Co, Rh, Ir, Ni, Pd, Pt, Cu, Ag, Au, Zn, Cd, silicides thereof and combinations thereof.

26. The structure of claim 17, further comprising one or more contacts on the backside of the substrate.

27. The structure of claim 17, further comprising an anti-reflective coating on the film or feature.

28. A photovoltaic device, a light sensor, an image sensor, a light emitting device, or a MEMS device or structure comprising the structure of claim 17.

* * * * *